(12) United States Patent
Berman

(10) Patent No.: US 11,855,772 B2
(45) Date of Patent: Dec. 26, 2023

(54) HIGH THROUGHPUT POLAR ECC DECODING VIA COMPRESSED SUCCESSIVE CANCELLATION ALGORITHM

(71) Applicant: SAMSUNG ELECTRONICS CO., LTD., Suwon-si (KR)

(72) Inventor: Amit Berman, Binyamina (IL)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 43 days.

(21) Appl. No.: 17/551,780

(22) Filed: Dec. 15, 2021

(65) Prior Publication Data

US 2023/0308208 A1 Sep. 28, 2023

(51) Int. Cl.
*H04L 1/00* (2006.01)
*H03M 13/11* (2006.01)
*H04L 1/1607* (2023.01)

(52) U.S. Cl.
CPC .............. *H04L 1/003* (2013.01); *H03M 13/11* (2013.01); *H04L 1/0057* (2013.01); *H04L 1/165* (2013.01)

(58) Field of Classification Search
CPC ....... H04L 1/003; H04L 1/0057; H04L 1/165; H03M 13/11
See application file for complete search history.

(56) References Cited

U.S. PATENT DOCUMENTS

| | | | |
|---|---|---|---|
| 2003/0007694 A1* | 1/2003 | Lee | G06T 9/004 375/E7.243 |
| 2020/0067528 A1* | 2/2020 | Arikan | H03M 13/13 |

OTHER PUBLICATIONS

Dizdar, O., et al., "A High-Throughput Energy-Efficient Implementation of Successive Cancellation Decoder for Polar Codes Using Combination Logic", IEEE Transactions on Circuits and Systems-I: Regular Papers, vol. 63, No. 3, Mar. 2016, pp. 436-447.
Arikan, E., "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.

* cited by examiner

*Primary Examiner* — Thien Nguyen
(74) *Attorney, Agent, or Firm* — Sughrue Mion, PLLC

(57) ABSTRACT

A storage system, including a storage device configured to store a plurality of encoded values, wherein each value of the plurality of encoded values has a predetermined value length and is within a predetermined range, and wherein the predetermined range is not a power of 2; and at least one processor configured to: group the plurality of encoded values into a codeword; obtain a plurality of bit chunks, wherein each bit chunk of the plurality of bit chunks represents a corresponding encoded value of the plurality of encoded values, and wherein a length of the each bit chunk is selected from among one or more predetermined bit chunk lengths which are determined based on the predetermined range; select a variable-length prefix from among a plurality of variable-length prefixes, wherein the variable-length prefix indicates bit chunk lengths of the plurality of bit chunks; obtain a compressed codeword including the variable-length prefix and the plurality of bit chunks; and decode the plurality of encoded values based on the compressed codeword.

20 Claims, 20 Drawing Sheets

|  | Number of bits used to represent each value | | | Prefix |
|---|---|---|---|---|
|  | First value | Second value | Third value |  |
| all values <= 63 | 6 | 6 | 6 | 0 |
| one value > 63 other values <= 63 | 4 | 6 | 6 | 001 |
|  | 6 | 4 | 6 | 011 |
|  | 6 | 6 | 4 | 101 |
| two values > 63 one value <= 63 | 4 | 4 | 6 | 00111 |
|  | 4 | 6 | 4 | 01111 |
|  | 6 | 4 | 4 | 10111 |
| all values > 63 | 4 | 4 | 4 | 0011111 |

| | Number of bits used to represent each value | | | | | Prefix |
|---|---|---|---|---|---|---|
| | First value | Second value | Third value | Fourth value | Fifth value | |
| all values <=15 | 4 | 4 | 4 | 4 | 4 | 0 |
| one value = 16 other values <=15 | 0 | 4 | 4 | 4 | 4 | 00001 |
| | 4 | 0 | 4 | 4 | 4 | 00011 |
| | 4 | 4 | 0 | 4 | 4 | 00101 |
| | 4 | 4 | 4 | 0 | 4 | 01001 |
| | 4 | 4 | 4 | 4 | 0 | 01011 |
| two values = 16 other values <=15 | 0 | 0 | 4 | 4 | 4 | 01101 |
| | 0 | 4 | 0 | 4 | 4 | 01111 |
| | 0 | 4 | 4 | 0 | 4 | 000010001 |
| | 0 | 4 | 4 | 4 | 0 | 000010011 |
| | 4 | 0 | 0 | 4 | 4 | 000010101 |
| | 4 | 0 | 4 | 0 | 4 | 000010111 |
| | 4 | 0 | 4 | 4 | 0 | 000011001 |
| | 4 | 4 | 0 | 0 | 4 | 000011011 |
| | 4 | 4 | 0 | 4 | 0 | 000011101 |
| | 4 | 4 | 4 | 0 | 0 | 0000010001 |
| three values = 16 other values <=15 | 0 | 0 | 0 | 4 | 4 | 0000010011 |
| | 0 | 0 | 4 | 0 | 4 | 0000010101 |
| | 0 | 0 | 4 | 4 | 0 | 0000010111 |
| | 0 | 4 | 0 | 0 | 4 | 0000011001 |
| | 0 | 4 | 0 | 4 | 0 | 0000011011 |
| | 0 | 4 | 4 | 0 | 0 | 0000011101 |
| | 4 | 0 | 0 | 0 | 4 | 0000011111 |
| | 4 | 0 | 0 | 4 | 0 | 00000010001 |
| | 4 | 0 | 4 | 0 | 0 | 00000010011 |
| | 4 | 4 | 0 | 0 | 0 | 00000010101 |
| four values = 16 other values <=15 | 0 | 0 | 0 | 0 | 4 | 00000010111 |
| | 0 | 0 | 0 | 4 | 0 | 00000011001 |
| | 0 | 0 | 4 | 0 | 0 | 00000011011 |
| | 0 | 4 | 0 | 0 | 0 | 00000011101 |
| | 4 | 0 | 0 | 0 | 0 | 00000011111 |
| all values = 16 | 0 | 0 | 0 | 0 | 0 | 00000000000011111 |

| | Number of bits used to represent each value | | | Prefix |
|---|---|---|---|---|
| | First value | Second value | Third value | |
| all values <=1 | 1 | 1 | 1 | 00 |
| one value = 2, other values <=1 | 0 | 1 | 1 | 001 |
| | 1 | 0 | 1 | 011 |
| | 1 | 1 | 0 | 101 |
| one value <=1, other values = 2 | 0 | 0 | 1 | 0111 |
| | 0 | 1 | 0 | 1111 |
| | 1 | 0 | 0 | 0010 |
| all values = 2 | 0 | 0 | 0 | 00110 |

FIG. 5C

HIGH THROUGHPUT POLAR ECC DECODING VIA COMPRESSED SUCCESSIVE CANCELLATION ALGORITHM

BACKGROUND

1. Field

Apparatuses and methods consistent with embodiments relate to a compression process, more particularly a fractional compression process.

2. Description of Related Art

Power consumption forms a scaling barrier in modern computer systems. Dynamic signal transitions dissipate more energy as frequency increases, and leakage currents are becoming more severe with transistor shrinkage. In parallel, product designers deal with higher performance demands of the market. Therefore, there are intensive efforts to reduce the number of embedded memory and logic gates per functional unit.

Memory components, for example register files, static random-access memory (SRAM) cells, embedded dynamic random-access memory (DRAM), and the like, may constitute a significant fraction in silicon layout. They often store multiple fields, that each can have possible values of $0, 1, \ldots, N-1$ where N is not a power of two, or non-dyadic, due to flow requirements. The stored data is thus compressible, but conventional compression techniques such as Huffman coding, Tunstall coding, arithmetic coding, etc., result in high gate-count compressor and decompressor, which offset the bit savings gain. Moreover, many conventional compression techniques output variable-length codewords that cannot guarantee gate count reduction because the design must to support the worst-case data distribution.

Similarly, the transmission of data that is constrained to take values of an interval that is not a power of two over long wires is likely to have serious power impact along with glitch and routing issues. Again, the complexity of conventional compression prevents redundancy cutback.

SUMMARY

According to embodiments, a storage system includes a storage device configured to store a plurality of encoded values, wherein each value of the plurality of encoded values has a predetermined value length and is within a predetermined range, and wherein the predetermined range is not a power of 2; and at least one processor configured to: group the plurality of encoded values into a codeword; obtain a plurality of bit chunks, wherein each bit chunk of the plurality of bit chunks represents a corresponding encoded value of the plurality of encoded values, and wherein a length of the each bit chunk is selected from among one or more predetermined bit chunk lengths which are determined based on the predetermined range; select a variable-length prefix from among a plurality of variable-length prefixes, wherein the variable-length prefix indicates bit chunk lengths of the plurality of bit chunks; obtain a compressed codeword including the variable-length prefix and the plurality of bit chunks; and decode the plurality of encoded values based on the compressed codeword.

According to embodiments, a storage device includes a memory configured to store a plurality of values, wherein each value of the plurality of values is within a range, and wherein the range is not a power of 2; a buffer; and at least one processor configured to: select a codeword length, wherein the codeword length is selected based on the range, determine a plurality of combinations of bit chunk lengths, wherein a number of the plurality of combinations is based on a number of power-of-2 components of the range; assign a plurality of prefixes to the plurality of combinations, wherein for each combination, a sum of the bit chunk lengths included in the each combination and a length of a corresponding prefix assigned to the each combination is less than the codeword length; and store the assigned plurality of prefixes in a table; group the plurality of values into a codeword having the codeword length; obtain a plurality of bit chunks, wherein each bit chunk of the plurality of bit chunks represents a corresponding value of the plurality of values, and wherein a length of the each bit chunk is selected from among the bit chunk lengths; select a prefix corresponding to the plurality of bit chunks based on the table; obtain a compressed codeword including the prefix and the plurality of bit chunks; and store the compressed codeword in the buffer.

According to embodiments, a method of controlling a storage system, the method being executed by at least one processor, includes obtaining, from a storage, a plurality of encoded values, wherein each value of the plurality of encoded values has a predetermined value length and is within a predetermined range, and wherein the predetermined range is not a power of 2; grouping the plurality of encoded values into a codeword; obtaining a plurality of bit chunks, wherein each bit chunk of the plurality of bit chunks represents a corresponding encoded value of the plurality of encoded values, and wherein a length of the each bit chunk is selected from among one or more predetermined bit chunk lengths which are determined based on the predetermined range; selecting a variable-length prefix from among a plurality of variable-length prefixes, wherein the variable-length prefix indicates bit chunk lengths of the plurality of bit chunks; obtaining a compressed codeword including the variable-length prefix and the plurality of bit chunks; and decoding the plurality of encoded values based on the compressed codeword.

According to embodiments, a method of controlling a storage device includes obtaining, from a memory, a plurality of values, wherein each value of the plurality of values is within a range, and wherein the range is not a power of 2; selecting a codeword length, wherein the codeword length is selected based on the range, determining a plurality of combinations of bit chunk lengths, wherein a number of the plurality of combinations is based on a number of power-of-2 components of the range; assigning a plurality of prefixes to the plurality of combinations, wherein for each combination, a sum of the bit chunk lengths included in the each combination and a length of a corresponding prefix assigned to the each combination is less than the codeword length; and storing the assigned plurality of prefixes in a table; grouping the plurality of values into a codeword having the codeword length; obtaining a plurality of bit chunks, wherein each bit chunk of the plurality of bit chunks represents a corresponding value of the plurality of values, and wherein a length of the each bit chunk is selected from among the bit chunk lengths; selecting a prefix corresponding to the plurality of bit chunks based on the table; obtaining a compressed codeword including the prefix and the plurality of bit chunks; and storing the compressed codeword in a buffer.

BRIEF DESCRIPTION OF THE DRAWINGS

FIGS. 5A-5C illustrate example prefix tables, according to embodiments.

DETAILED DESCRIPTION

Figure 1:
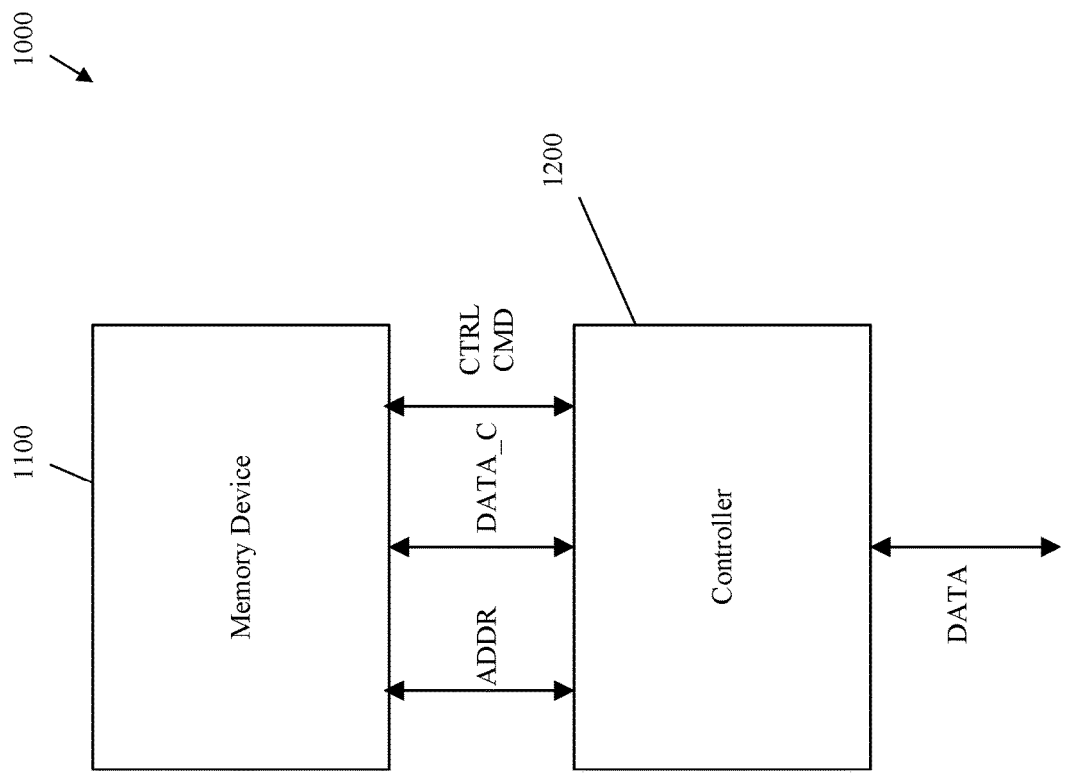
FIG. 1 is a block diagram of a memory system according to embodiments.

FIG. 1 is a block diagram schematically illustrating a memory system according to an example embodiment. Referring to FIG. 1, a memory system 1000 may include a memory device 1100 and a controller 1200.

The memory device 1100 may be configured to perform write, read, and erase operations according to a control of the controller 1200. In embodiments, the memory device 1100 may be, for example, a nonvolatile memory device.

The controller 1200 may be connected to a host and the memory device 1100. The controller 1200 may access the memory device 1100 in response to a request from the host. For example, the controller 1200 may be configured to control write, read, and erase operations of the memory device 1100. The controller 1200 may be configured to provide an interface between the memory device 1100 and the host. The controller 1200 may be configured to drive firmware for controlling the memory device 1100.

The controller 1200 may receive data from the host. The controller 1200 may encode the input data, for example DATA as shown in FIG. 1, to generate coded data DATA_C. The controller 1200 may be configured to provide a control signal CTRL and an address ADDR to the memory device 1100. The controller 1200 may be configured to exchange the coded data DATA_C with the memory device 1100. The controller 1200 may receive the coded data DATA_C from the memory device 1100 to decode the coded data DATA_C. The controller 1200 may transfer the decoded data, for example DATA as shown in FIG. 1, to the host.

In embodiments, the memory system 1000 may be a solid state drive (SSD) including form factors such as memory card form factors including Secure Digital and variations thereof, and etc., as standard hard disk drive (HDD) form factors, standard card form factors, including mini-Serial AT Attachment (mSATA), PCI Express Mini Card, M.2, etc., disk-on-a-module form factors with interfaces such as Parallel ATA (PATA) or SATA, box form factors for applications such as rack-mount systems, bare-board form factors including PCI Express (PCIe), mini PCIe, mini-dual in-line memory module (DIMM), MO-297, etc., and ball grid array form factors.

The memory device 1100 may be, but is not limited to, a flash memory device, a NAND flash memory device, a phase change RAM (PRAM), a ferroelectric RAM (FRAM), a magnetic RAM (MRAM), etc. The memory device 1100 may have a planar structure or a three-dimensional (3D) memory cell structure with a stack of memory cells. Each of the memory cells may include levels to store respective bits of data. The memory device 1100 may be implemented, for example, as a memory chip (e.g., a NAND chip). Though, for the purpose of simplicity, only one nonvolatile memory device 2000 is illustrated in FIG. 1, the memory system 1000 may include several nonvolatile memory devices (e.g., memory chips) arranged in multiple ways and connected to the controller 1200 via multiple channels.

Figure 2:
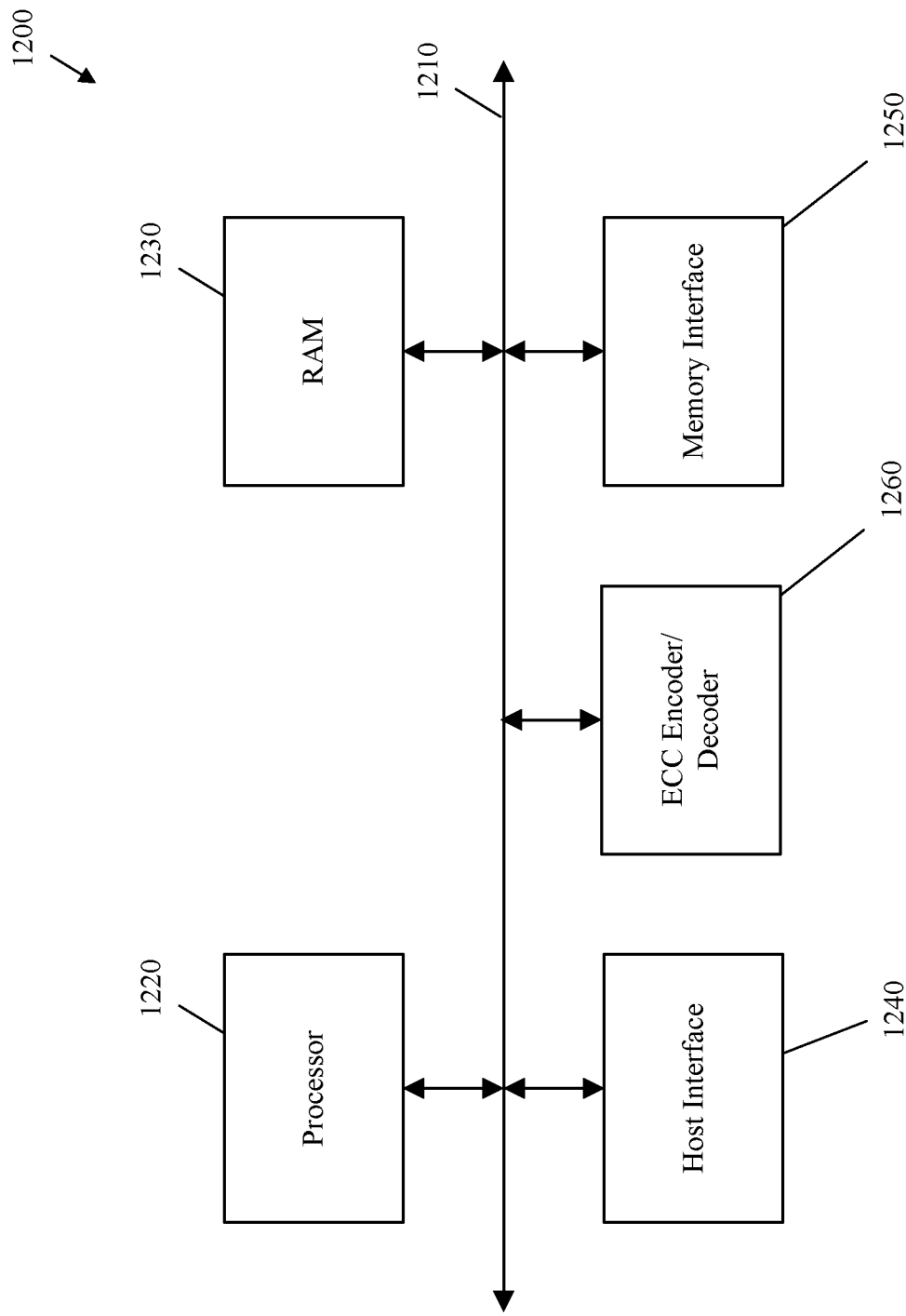
FIG. 2 is a block diagram schematically illustrating a controller according to embodiments.

FIG. 2 is a block diagram schematically illustrating a controller according to embodiments. Referring to FIG. 2, a controller 1200 may include a system bus 1210, a processor 1220, a RAM 1230, a host interface 1240, a memory interface 1250, and an error correction coding (ECC) encoder/decoder 1260.

The system bus 1210 may provide a channel among the components 1220 to 1260 of the controller 1200. The processor 1220 may control an overall operation of the controller 1200. The RAM 1230 may be used as at least one of a working memory, a cache memory, and a buffer memory. The host interface 1240 may communicate with an external device (e.g., a host) via at least one of various communications standards such as USB (Universal Serial Bus), MMC (multimedia card), PCI (peripheral component interconnection), PCI-E (PCI-express), ATA (Advanced Technology Attachment), Serial-ATA, Parallel-ATA, SCSI (small computer small interface), ESDI (enhanced small disk interface), IDE (Integrated Drive Electronics), and a Firewire.

The memory interface 1250 may interface with a nonvolatile memory device, for example memory device 1100 as shown in FIG. 1. The memory interface 1250 may include a NAND interface or a NOR interface.

The ECC encoder/decoder 1260 may perform ECC encoding on data received from an external host and ECC decoding on data received from the memory device 1100. For example, the ECC encoder/decoder 1260 may code input data, received for example as DATA shown in FIG. 1, to generate coded data DATA_C. In addition, the ECC encoder/decoder 1260 may receive coded DATA_C, and decode the coded DATA_C to reconstruct or recover data, and output the reconstructed or recovered data as DATA as shown in FIG. 1. In embodiments, the ECC encoding may be for example polar code encoding, and the ECC decoding may be for example polar code decoding.

Figure 3:
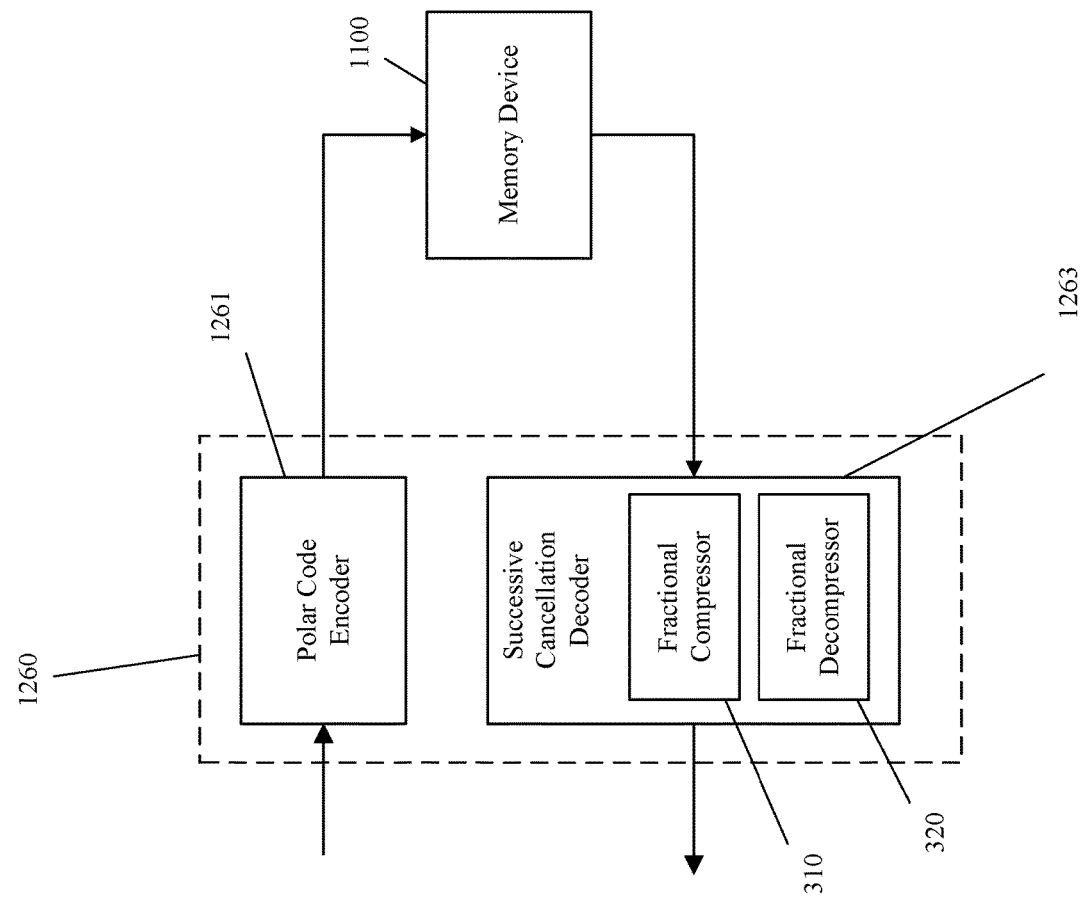
FIG. 3 is a block diagram schematically illustrating an example of an error correction coding (ECC) encoder/decoder, according to embodiments.

FIG. 3 is a block diagram schematically illustrating an example of an ECC encoder/decoder 1260 according to embodiments. Referring to FIGS. 2 and 3, the ECC encoder/decoder 1260 may include one or both of a polar code encoder 1261 and a successive cancellation decoder 1263.

The polar code encoder 1261 may receive a plurality of information word bits. The information word bits may be received, for example, from a host. The polar code encoder 1261 may perform polar code encoding on the information word bits to generate polar coded values corresponding to the information word bits. The polar coded values may be programmed at a memory device 1100. Data programmed at the memory device 1100 may be read as read polar coded values. The successive cancellation decoder 1263 may perform successive cancellation decoding on the read polar coded values to generate information word bits, for example by reconstructing or recovering the information word bits received from the host.

The memory device 1100 may be understood to be a channel where polar coded values encoded by the polar code encoder 1261 are transferred. In example embodiments, the ECC encoder/decoder 1260 may include the successive cancellation decoder 1263. Successive cancellation decoder 1263 may perform successive cancellation on the read polar coded values in order to generate the information word bits.

In embodiments, the successive cancellation decoder 1263 may include at least one of a fractional compressor 310 and a fractional decompressor 320. The fractional compressor 310 and the fractional decompressor 320 may be used to perform some or all of a fractional compression process, for example one or more of processes 4000, 9100, 9200, and 9300 described below, during successive cancellation decoding.

In embodiments, fractional compression may be used to compress a vector of non-dyadic values with low compressor and decompressor gate-count overhead, thereby making compression feasible for utilization. In embodiments, dyadic values may refer to values which may be expressed as a power of 2, and non-dyadic values may refer to values which cannot be expressed as a power of 2. In other words, dyadic values may refer to values which may be expressed as $2n$, and non-dyadic values may refer to values which cannot be expressed as $2n$, where n is an integer.

In embodiments, fractional compression may operate on a fixed number of input bits and output a fixed number of output bits, which may be referred to as fixed-to-fixed compression. Fixed-to-fixed compression may allow, for example, at least one of memory reduction and bus narrowing. In embodiments, fractional compression may be used by at least one of fractional compressor 310 and fractional decompressor 320 during successive cancellation in ECC decoding, for example ECC decoding using polar codes.

In embodiments, the codewords used in fractional compression may be partially systematic. As result, the compressed bits may hold a fractional piece of the input value, which may be concatenated with prefix code that completes the represented value and may also be used for unique decoding. Fractional compression may use a small dictionary that can be implemented with a multiplexer, and in embodiments, corresponding hardware can be tuned to compress and decompress the data within less than a single clock cycle.

Figure 4A:
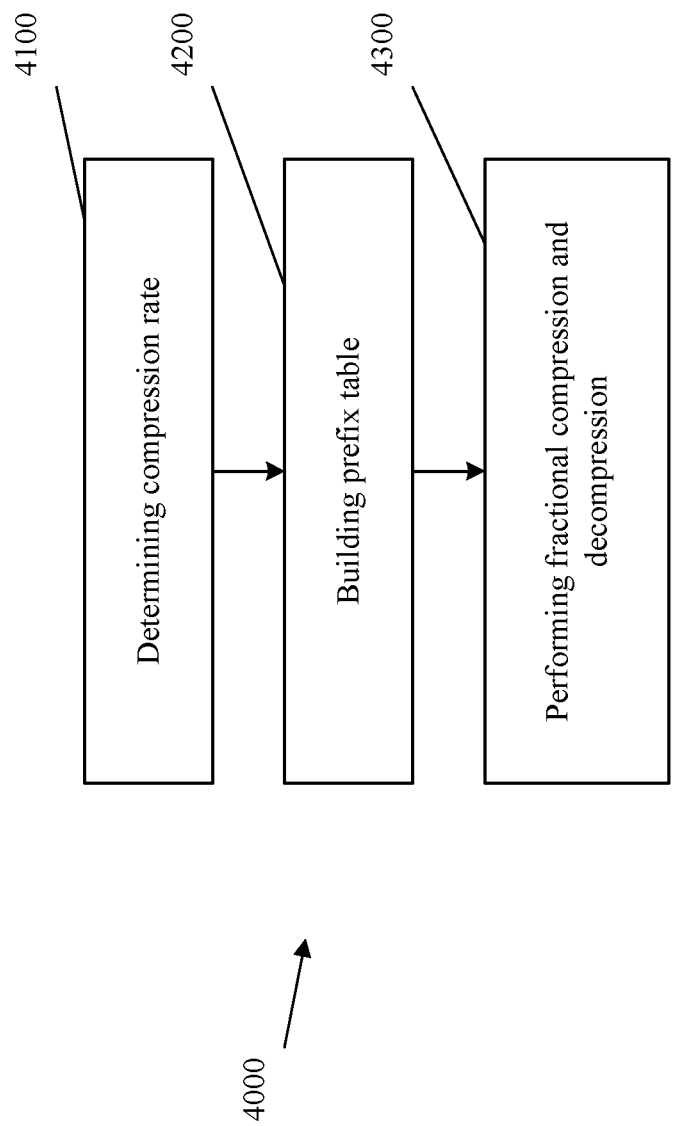
FIGS. 4A-4D are flowcharts of processes for constructing and using a fractional compressor and fractional decompressor for fractional compression.
Figure 4B:
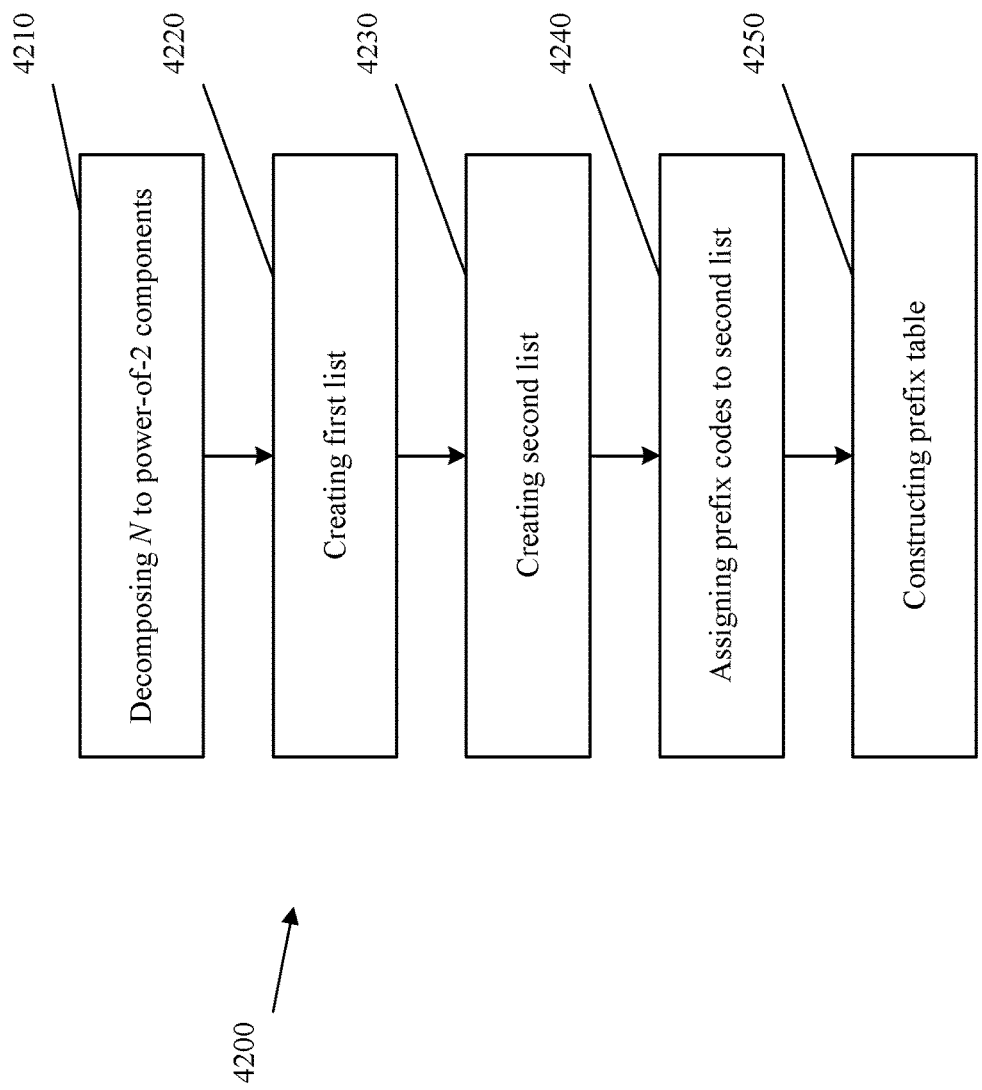

FIGS. 4A-4B are block diagrams of a process 4000 for constructing and using a fractional compressor and fractional decompressor for fractional compression, according to embodiments. For simplicity, the fractional compressor and the fractional decompressor may be referred to herein simply as compressor and decompressor, respectively. In embodiments, the compressor described with respect to process 4000 may correspond to any compressor described herein, for example fractional compressor 310, fractional compressor 6100, fractional compressor 7100, and fractional compressor 8100. In embodiments, the decompressor described with respect to process 4000 may correspond to any decompressor described herein, for example fractional decompressor 320, fractional decompressor 7200, and fractional decompressor 8300.

As used herein, a ceiling function $f(x)=\lceil x \rceil$ may refer to a function that maps any real number x to the smallest integer not less than x. Similarly, a floor function $f(x)=\lfloor x \rfloor$ may assign the largest integer not greater than x. For example, $\lceil 6.3 \rceil = 7$, $\lfloor 6.3 \rfloor = 6$. The input of process 4000 may be a binary vector of values, taken from a range of [0, 1, . . . , N−1]. The output may be a binary vector with fewer bits, whose size is determined by N and compressor/decompressor complexity. In embodiments, the binary vector of values may correspond to the polar coded values discussed above. In some embodiments, the binary vector of values may correspond to a variable nodes vector used in successive cancellation decoding.

As shown in FIG. 4A, process 4000 may include determining the compression rate at operation 4100. In embodiments, the compression rate may be the ratio between the compressed data and uncompressed data, and may be denoted with R. The compression rate may be calculated using Equation 1, shown below:

$$R(k, N) = \frac{\lceil k \cdot \log_2 N \rceil}{k \cdot \lceil \log_2 N \rceil} \quad \text{(Equation 1)}$$

In Equation 1 above, k represents a number of values having the range [0, 1, . . . , N−1] which are to be included in each fractional compression codeword. Therefore, for a given N, the compression rate R may be determined by selecting k. In embodiments, a default value of k may be obtained using Equation 2 below:

$$k = \left\lfloor \frac{1}{\log_2 N - \lfloor \log_2 N \rfloor} \right\rfloor \quad \text{(Equation 2)}$$

The upper bound of R is $\log_2 N / \lceil \log e N \rceil$. By placing multiple k values together in a codeword and then compressing the codeword, a length of the binary representation of the compressed codeword can be obtained by $\lceil k \cdot \log_2 N \rceil$, and the rate is determined by $\lceil k \cdot \log_2 N \rceil / (k \lceil \log_2 N \rceil)$. High k values may not lead to better compression unless the difference $\lceil k \cdot \log_2 N \rceil - k \cdot \log_2 N$ is minimized. High k may increase the complexity of the compressor and decompressor. Therefore, in some embodiments, the lowest possible k may be used.

In embodiments, process 4000 may be useful when the interval size N is small. For example, N=5 compression can reach a compression rate R of $\log_2 5/3=0.77$, which translates to 23% area savings. As another example, at N=600, the rate can reach $\log_2 600/10=0.92$, only 8% savings. However, the value of process 4000 may be proportional to initial memory or transmission size, e.g., an effective reduction of 23% in 20 kilo-gates (KG) memory is 4.6 KG, but lower efficiency of 8% out of 150 KG is 12 KG.

As further shown in FIG. 4A, process 4000 may further include building a prefix table that may be used to construct the compressor and decompressor at operation 4200. FIG. 4B shows an example of operation 4200, according to embodiments.

As shown in FIG. 4B, operation 4200 may include decomposing N into power-of-2 components $\{n_1, n_2, \ldots, n_m\}$ at operation 4210, using for example Equation 3 below, where w and j are indices:

$$N = \sum_{w \in \{n_1, n_2, \ldots, n_m | n_i \neq n_j, 1 \leq i \leq j \leq m\}} 2^w \quad \text{(Equation 3)}$$

According to embodiments, during fractional compression, a fixed number of bits may be allocated for each value. In embodiments, this fixed number of bits may be referred to as a bit chunk, and this bit chunk may have fewer bits than the uncompressed value that it represents. The allowed bit chunk sizes for value allocation may be determined by the power components when decomposing N to the power of 2 during operation 4210. Such disassembly may be achieved by writing N in its base-2 representation and assigning $n_1$, $n_2$, ..., $n_m$ as the corresponding indices (starting from zero) that are 1 at the base-2 form.

As further shown in FIG. 4B, operation 4200 may further include creating a first list of $m^k$ strings at operation 54220. Given m possible bit-size allocations for each value and k values, there are $m^k$ combinations, which may be the strings included in the first list. Each string may be constructed from a combination of k elements $\{e_1, e_2, \ldots, e_k\}$ out of $\{n_1, n_2, \ldots, n_m\}$, where each element can be chosen more than once. In embodiments, the elements may correspond to the bit chunks discussed above. In embodiments, the length of each string may be expressed as $$\sum_{i=1}^{k} e_i,$$

where i is an index.

In process 4000, a compressed codeword generated by a compressor may be $\lceil k \cdot \log_2 N \rceil$ bits long, and each combination in the first list may include fewer bits than $\lceil k \cdot \log_2 N \rceil$. Therefore, in order to ensure that each compressed codeword includes the proper number of bits, the spare bits in each string may be gathered in a second list in operation 4230. In embodiments, the length of each string in the second list may be expressed as $$\lceil k \cdot \log_2 N \rceil - \sum_{i=1}^{k} e_i$$

bits.

As further shown in FIG. 4B, operation 4200 may include assigning prefix codes at operation 4240 for unique identification of value's bit allocations. At operation 4250, the first list and the second list may be merged to generate a prefix table, which may be a translation table to be used during compression and decompression. In the prefix table, each combination of $\{e_1, e_2, \ldots, e_k\}$ elements or bit chunks may be matched to a corresponding set of prefix bits.

Figure 4C:
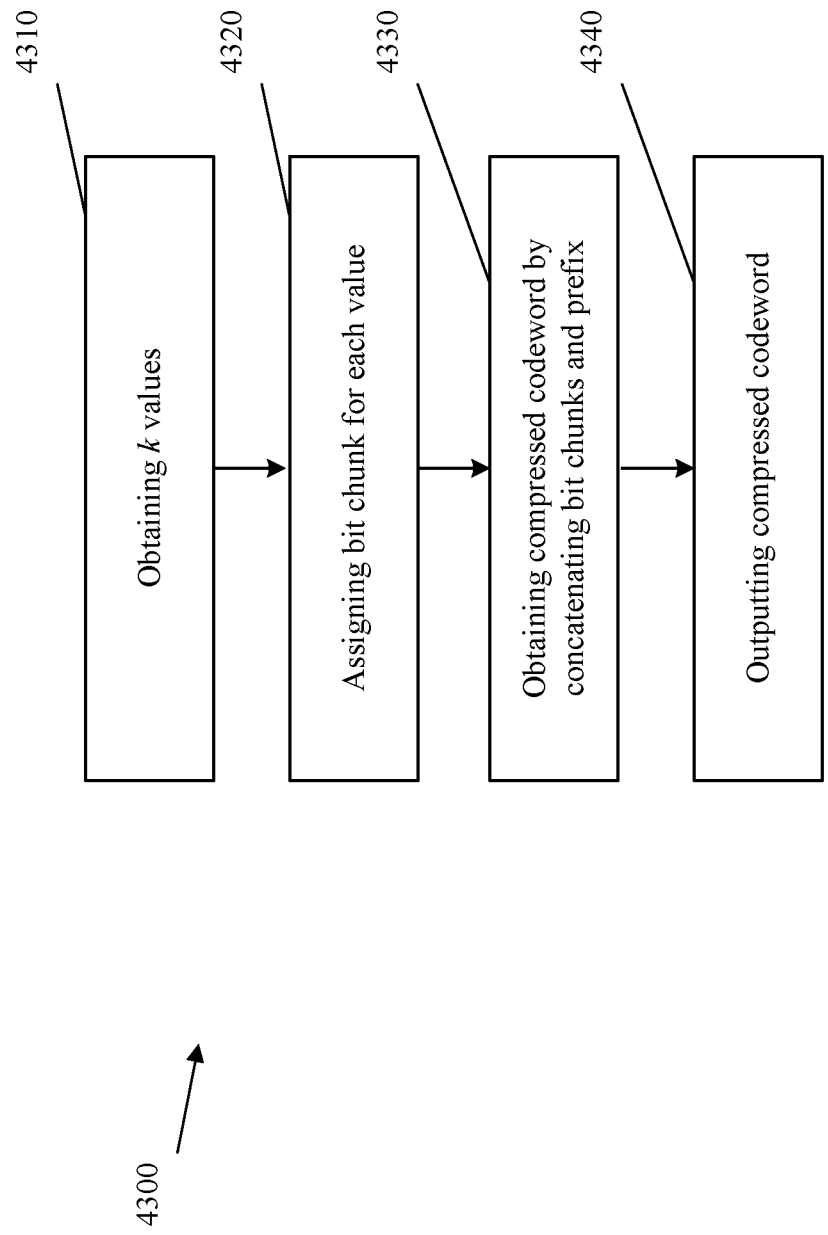
Figure 4D:
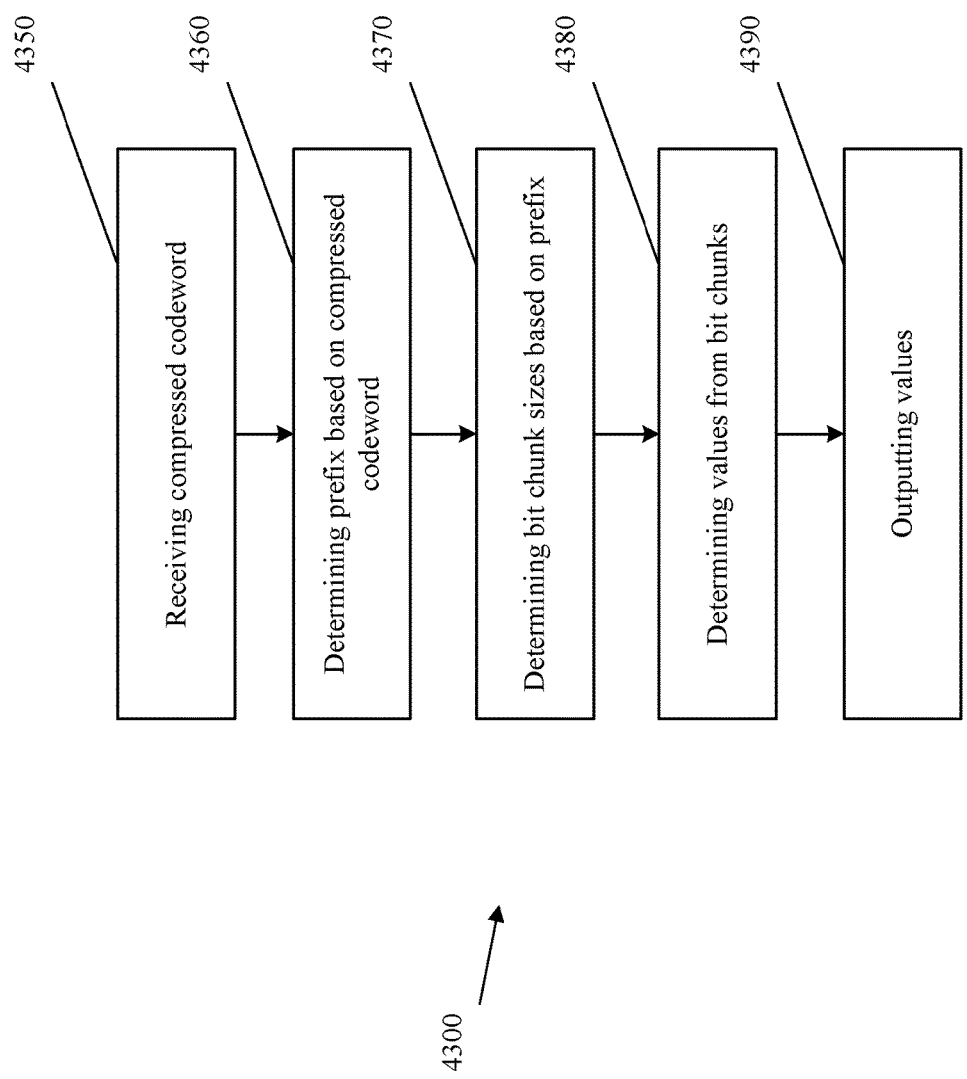

Returning again to FIG. 4A, process 4000 may further include constructing and using one or more of the compressor and decompressor at operation 4300. FIGS. 4C and 4D show examples of operation 4300, according to embodiments.

As shown in FIG. 4C, operation 4300 may include obtaining k values, each having the range [0, 1, ..., N−1], for a total input size of $k \lceil \log_2 N \rceil$ bits, at operation 4310.

As further shown in FIG. 4C, operation 4300 may include assigning a bit chunk for each value of the k values. For example, at the compressor, each value may be compared against the decomposition segments of N. If the value $<2^{n_1}$, the value may be represented by $n_1$ bits. For example, if the value is within a first segment $0, 1, \ldots, 2^{n_1}-1$, then the value may be fully represented by $2^{n_1}$ 1 bits.

If $$\sum_{i=1}^{j} 2^{n_i} \leq \text{value} < \sum_{i=1}^{j} 2^{n_i} + 2^{n_{j+1}}, 1 \leq j < m, n_{j+1} \neq 0,$$

then an offset from $$\sum_{i=1}^{j} 2^{n_i}$$

may be determined, and the value may be represented by the offset from $$\sum_{i=1}^{j} 2^{n_i}.$$

For example, if the value is between $2^{n_1}, 2^{n_1}+1, \ldots, 2^{n_1}$, the offset from $2^{n_1}-1$ may be calculated, and the value may be represented using nz bits. Similarly, all k values are assigned k bit chunks out of $\{n_1, n_2, \ldots, n_m\}$ in operation 4320. Note that $n_m$ can be zero, and in that case, the bit chunk is null.

As further shown in FIG. 4C, operation 4300 may include concatenating the k bit chunks and a corresponding prefix selected from the prefix table to generate a compressed codeword corresponding to the k values at operation 4330. The prefix may uniquely identify the combination of bit chunk lengths used to construct the compressed codeword, which may allow the decompressor to be able to determine how many bits are assigned to each value. The compressed codeword may be output, for example by the compressor, at operation 4340.

As shown in FIG. 4C, operation 4300 may include receiving, at the decompressor, the compressed codeword at operation 4350. At operation 4360, the decompressor may detect the variable-length prefix. For example, the decompressor may examine the last bits of the compressed codeword, and may determine the prefix based on a pattern of the last bits of the compressed codeword.

As further shown in FIG. 4C, operation 4300 may include finding a combination of values-to-bits assignment $\{e_1, e_2, \ldots, e_k\}$ according to the prefix using the prefix table at operation 4370. In embodiments, operation 4370 may include determining bit chunk sizes of the bit chunks included in the compressed codeword.

As further shown in FIG. 4C, operation 4300 may further include determining the decompressed codeword based on the bit chunks using the determined bit chunk sizes at operation 4380. If the prefix indicates that a particular bit chunk represents an offset value, operation 4380 may further include calculating the value based on the offset. For each offset value $e_w$ of size $n_j$ bits, the decoded value may be represented $$\sum_{i=1}^{j-1} 2^{n_i} + e_w.$$

If $e_w$ is null, the decoded value may be represented as $$\sum_{i=1}^{m} 2^{n_i},$$

which may be N−1.

As further shown in FIG. 4C, operation 4300 may further include outputting the decompressed codeword including k values, each of size $\lceil \log_2 N \rceil$ at operation 4390.

Three examples of process 4000 are provided below as Examples 1-3. FIGS. 5A-illustrate example prefix tables, according to embodiments, which may correspond to Examples 1-3, as discussed in greater detail below.

In Example 1, N=80. Each uncompressed value may be represented with 7 bits. According to operation 4100, the default value of k can be calculated as $$k = \left\lfloor \frac{1}{\log_2 N - \lfloor \log_2 N \rfloor} \right\rfloor = \left\lfloor \frac{1}{6.32 - 6} \right\rfloor = 3.$$

By using the calculated k, each codeword is 3 values, each of 7 bits, for a total codeword length of 21 bits. The output is a compressed codeword of $\lceil k \cdot \log_2 N \rceil = \lceil 3 \cdot 6.32 \rceil = 19$ bits. The compression ratio is therefore R=19/21=0.9.

After determining the memory savings, the prefix table may be constructed at operation 4200. N=80 at base-2 representation is 1010000. Therefore, $80 = 2^6 + 2^4$, and each value can be assigned either 6 or 4 bits: $\{n_1=6, n_2=4\}$. At operation 4220, a list of $m^k = 2^3 = 8$ combinations may be built from possible bit allocations. Each combination is 12 to 18 bits, which leaves 1 to 7 spare bits for each compressed codeword at operation 4230. Those spare bits are assigned prefix code for the unique detection of used combination at operation 4240. FIG. 5A illustrates an example of a complete prefix table which may be constructed for Example 1 at operation 4250.

At operation 4300, the compressor and decompressor may be constructed. The compressor may receive three values at operation 4310. Then, at operation 4320, for each value, if it is lower than $2^6=64$, it may be adequately represented by a bit chunk of 6 bits. Otherwise, if the value is greater than or equal to 64, and less than $2^6+2^4=80$, it may be represented by a bit chunk of 4 bits, which represents the offset from 64. The bit chunks may be concatenated with prefix bits at operation 4330, and the compressed 19-bit codeword may be stored or transmitted at operation 4340.

At operation 4350, the decompressor may receive the compressed codeword. At operation 4360, a variable-length prefix is detected, and the number of bits for each value may be determined from the prefix table. If the value is assigned a bit chunk of 6 bits, the bit chunk may be concatenated with 0 as the most significant bit (MSB). If the value assigned a bit chunk of 4 bits, the bit chunk may be concatenated with 100 at the MSB. The decoded output is three 7-bits explicit values.

An example of operations 4320 and 4330 in the context of Example 1 is presented below:

At operation 4320, the compressor may receive three values, for example value-1, value-2, and value-3. Each value may be in the range [0, 1, 2, . . . , 79], and may be represented by 7 bits, as shown in Table 1 below:

TABLE 1

| value-1 | value-2 | value-3 |
|---|---|---|
| 0 . . . 79 | 0 . . . 79 | 0 . . . 79 |

If all values are <63, each value can be represented in 6 bits, and the additional prefix bit may be 0, as shown in Table 2 below:

TABLE 2

| value-1 | value-2 | value-3 | Prefix Bits |
|---|---|---|---|
| 6 bits | 6 bits | 6 bits | 0 |

Else, if the only the first value is >63 and the two others are <63, the first value can be represented as a 4 bit offset from 64, and the two others can be represented in 6 bits. The additional prefix bits may be 001, as shown in Table 3 below:

TABLE 3

| value-1 | value-2 | value-3 | Prefix Bits |
|---|---|---|---|
| 4 bits | 6 bits | 6 bits | 001 |

Else, if the only second value is >63 and two others <63, the prefix above may be modified, as shown in Table 4 below:

TABLE 4

| value-1 | value-2 | value-3 | Prefix Bits |
|---|---|---|---|
| 6 bits | 4 bits | 6 bits | 011 |

Else, if the only third value is >63 and two others <63, the prefix above may be modified, as shown in Table 5 below:

TABLE 5

| value-1 | value-2 | value-3 | Prefix Bits |
|---|---|---|---|
| 6 bits | 6 bits | 4 bits | 101 |

Else, if both first and second values are >63 and third value <63, the first two values may represented with 4 bits, and the third value with 6 bits, and the additional prefix bits may be 00111, as shown in Table 6 below:

TABLE 6

| value-1 | value-2 | value-3 | Prefix Bits |
|---|---|---|---|
| 4 bits | 4 bits | 6 bits | 00111 |

Else, if the first and third values are >63 and the second value is <63 the prefix above may be modified, as shown in Table 7 below:

TABLE 7

| value-1 | value-2 | value-3 | Prefix Bits |
|---|---|---|---|
| 4 bits | 6 bits | 4 bits | 01111 |

Else, if the second and third values are >63 and the first value is <63, the prefix above may be modified, as shown in Table 8 below:

TABLE 8

| value-1 | value-2 | value-3 | Prefix Bits |
|---|---|---|---|
| 6 bits | 4 bits | 4 bits | 10111 |

Else, if all values are >63, all values may be represented as 4 bit offsets from 64, and the additional prefix bits may be 0011111, as shown in Table 9 below:

TABLE 9

| value-1 | value-2 | value-3 | Prefix Bits |
|---|---|---|---|
| 4 bits | 4 bits | 4 bits | 0011111 |

In Example 2, N=17. Each uncompressed value is taken from [0, 1, . . . , 16] and may be represented as 5 bits. According to operation 4100, the default value of k can be calculated as $$k = \left\lfloor \frac{1}{\log_2 N - \lfloor \log_2 N \rfloor} \right\rfloor = \left\lfloor \frac{1}{4.0875 - 4} \right\rfloor = 11.$$

The decomposition of N is $17=2^4+2^0$, resulting in m=2. In order to reduce the gate-count, even further k may be reduced to 5, and the compression rate may slightly increases from 0.81 to 0.84.

Therefore, each uncompressed codeword may include 5 values, each having 5 bits, for a total codeword length of 25 bits. The output may be a compressed codeword of $\lceil k \cdot \log_2 N \rceil$=[5·4.08]=21 bits. Each value can be assigned either 4 or zero (null) bits. The number of combinations is $$\sum_{i=1}^{m} \binom{k}{i} = \sum_{i=0}^{5} \binom{5}{i} = 32,$$

which is also the number of prefix strings. FIG. 5B illustrates an example of a complete prefix table which may be constructed for Example 2 at operation 4250.

In Example 3, N=3. Each uncompressed codeword is taken from [0, 1, 2] and may be represented as 4 bits. According to operation 4100, the default value of k can be calculated as $$k = \left\lfloor \frac{1}{0.585} \right\rfloor = 1,$$

which results in a compression rate of R=1 (no compression). Therefore, k may be increased to 3, which provides a compression rate of $$R(k=3, N=3) = \frac{\lceil k \cdot \log_2 N \rceil}{k \cdot \lceil \log_2 N \rceil} = \frac{5}{6} = 0.83,$$

versus bound of $$\frac{\log_2 3}{2} = 0.79.$$

The decomposition of N is $3=2^1+2^0$, therefore m=2. Therefore, each uncompressed codeword may include three values, each having 2 bits, for a total codeword length of 6 bits. The output may be a compressed codeword of $\lceil k \cdot \log_2 N \rceil$=[3·1.58]=5 bits. Each value can be assigned one or zero (null) bits. FIG. 5C illustrates an example of a complete prefix table which may be constructed for Example 2 at operation 4250.

In Examples 1-3 discussed above, the prefixes in the prefix tables are shown as being included at the end of the compressed codeword, for example as the last bits of the compressed codeword. In embodiments, the prefixes can be included in other portions of the compressed codeword, for example at the beginning of the compressed codeword.

Although FIGS. 4A-4D show example blocks of the process 4000, in some implementations, the process 4000 may include additional blocks, fewer blocks, different blocks, or differently arranged blocks than those depicted in FIGS. 4A-4D. Additionally, or alternatively, two or more of the blocks depicted in FIGS. 4A-4D may be arranged or combined in any order, or performed in parallel.

Figure 6:
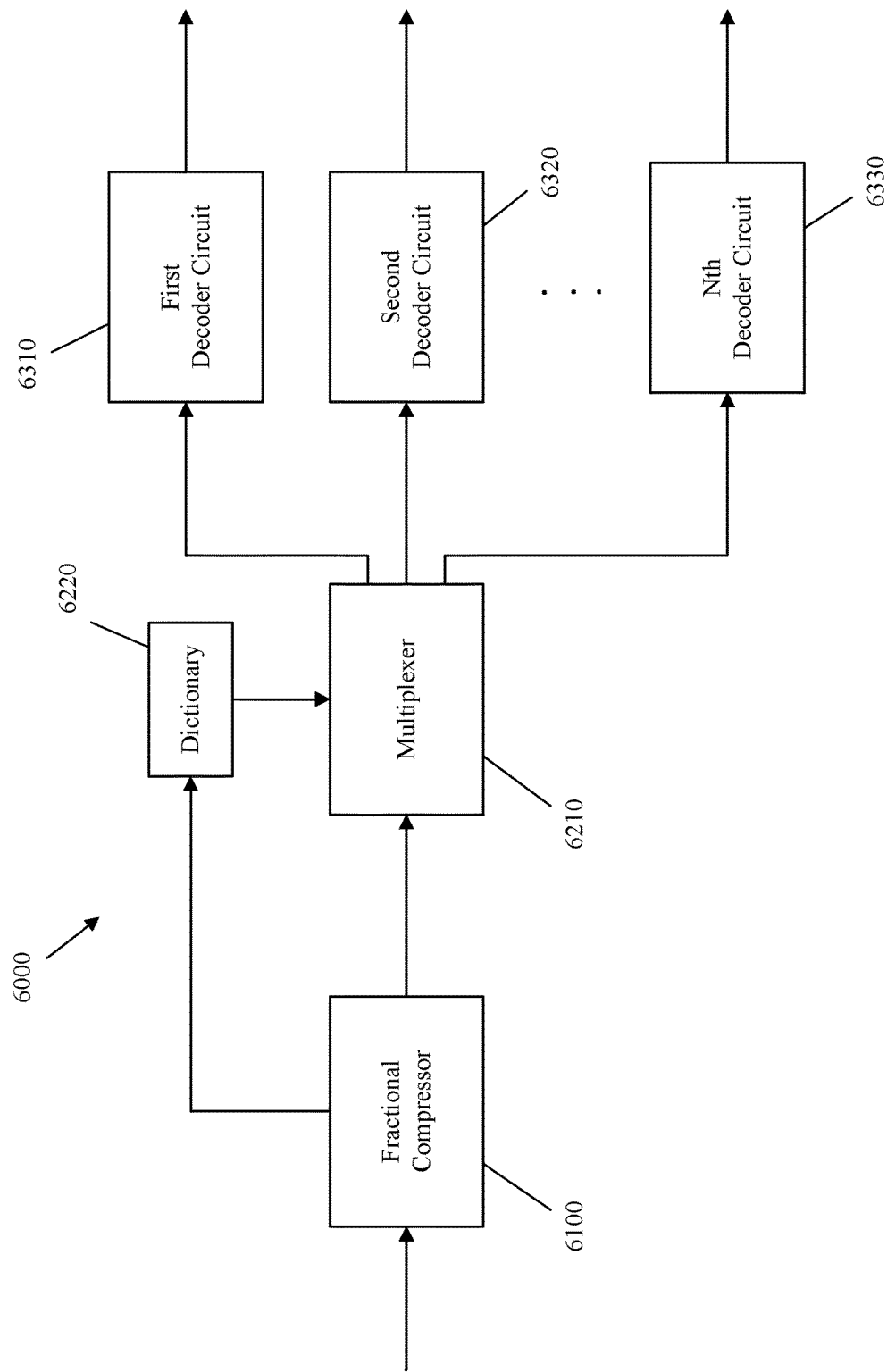
FIG. 6 is a block diagram of a fractional compression module, according to embodiments.

FIG. 6 is a block diagram of an example of a fractional compression module 6000, according to embodiments. A plurality of values may be obtained by a fractional compressor 6100, which may compress the plurality of values into a compressed codeword. The fractional compressor 6100 may provide the compressed codeword to a multiplexer 6210 which may distribute the compressed codeword to one of first through nth decoder circuits 6310-6330. In embodiments, at least one of the compressed codeword or the prefix may be provided to a dictionary module 6220, which may store a prefix table storing prefixes used by the fractional compressor, and may control the multiplexer based on the prefix table to provide the compressed codeword to an appropriate decoder circuit. For example, first decoder circuit 6310 may be configured to receive compressed codewords having a first prefix, second decoder circuit 6320 may be configured to receive compressed codewords having a second prefix, and nth decoder circuit 6330 may be configured to receive compressed codewords having an nth prefix.

In embodiments, each of the first through nth decoder circuits 6310-6330 may be configured to receive a compressed codeword generated based on encoded values, and directly output decoded values. As discussed above, a compressed codeword may be regarded as a compact representation of the values used to generate the compressed codeword. Accordingly, the first through nth decoder circuits 6310-6330 may be configured to perform arithmetic operations corresponding to, for example, successive cancellation decoding, based on the compact representation of the values rather than the values themselves. In embodiments, the first through nth decoder circuits 6310-6330 may be implemented using hardware such as combinatorial logic gates which may be tuned to provide decoded values for an appropriate compressed codeword. In embodiments, the decoded values may be provided in less than a single clock cycle.

Figure 7:
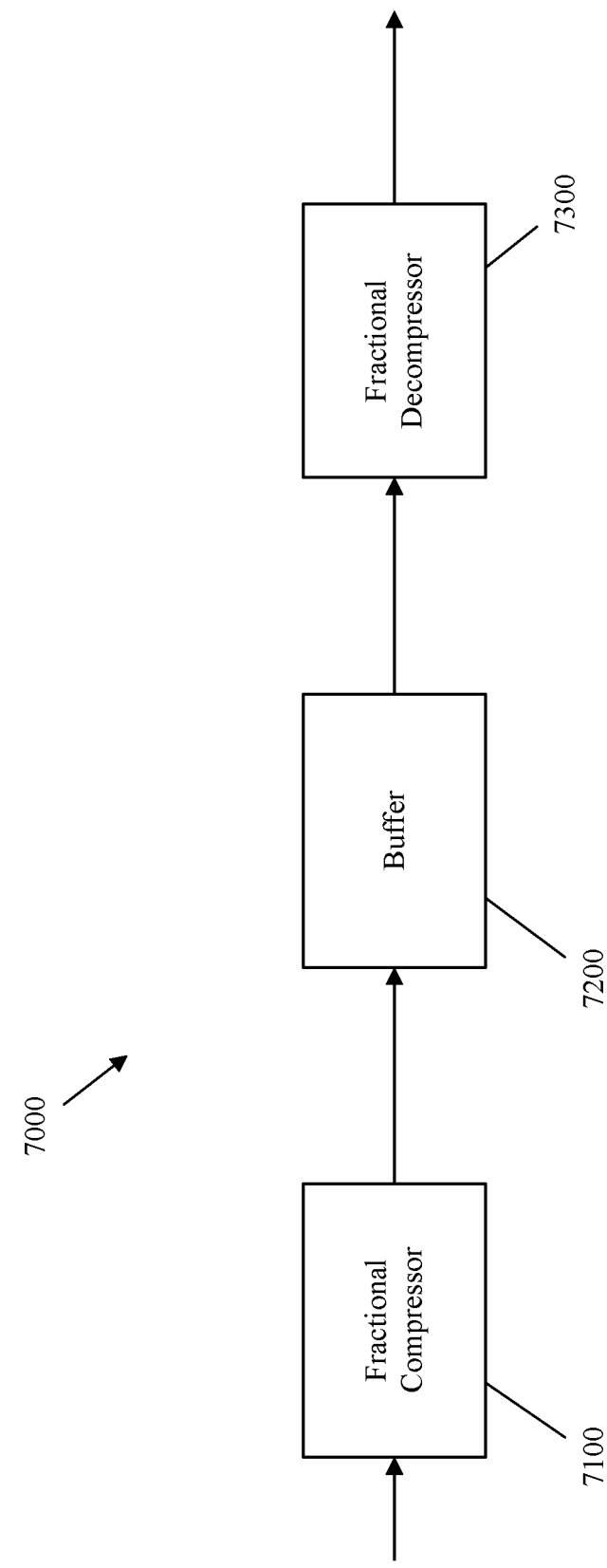
FIG. 7 is a block diagram of a fractional compression module, according to embodiments.

FIG. 7 is a block diagram of an example of a fractional compression module 7000, according to embodiments. A plurality of values may be obtained by a fractional compressor 7100, which may compress the plurality of values into a compressed codeword. The fractional compressor 7100 may provide the compressed codeword to a buffer 7200. In embodiments, the buffer 7200 may include, for example, flip-flop registers or embedded memory such as static random-access memory (SRAM). The buffer 7200 may provide the compressed codeword to fractional decompressor 7300 to decompress the compressed codeword and provide the values.

Figure 8:
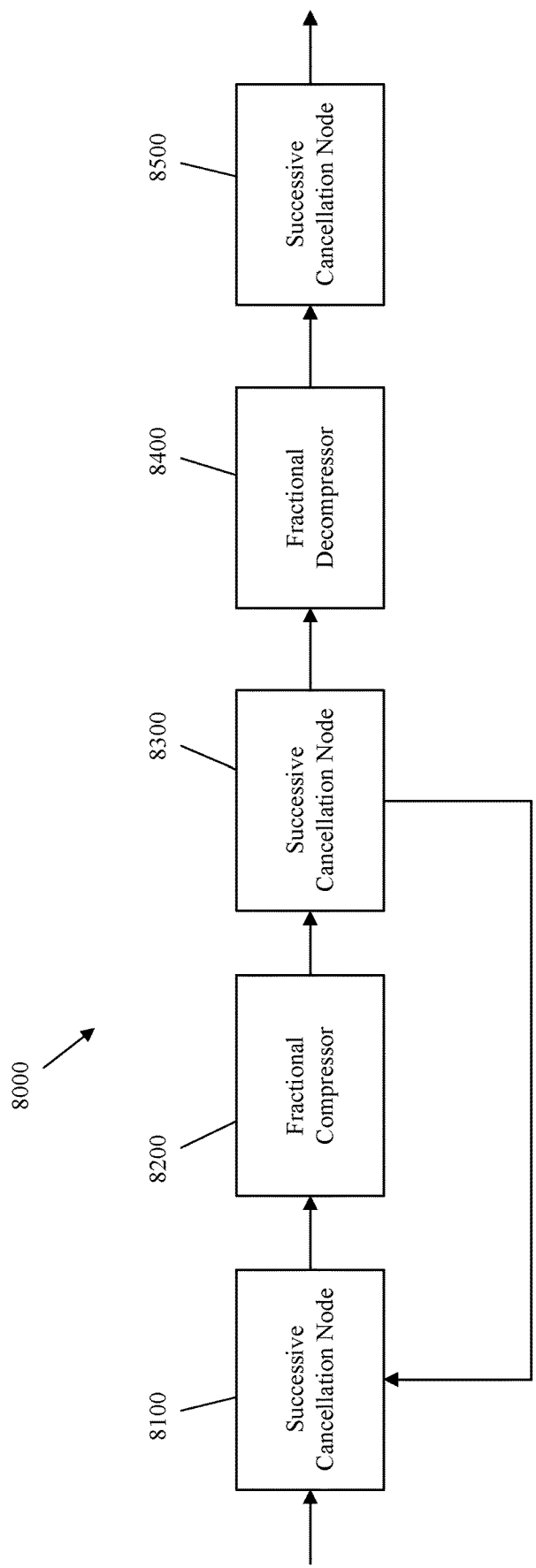
FIG. 8 is a block diagram of a fractional compression module, according to embodiments.

FIG. 8 is a block diagram of an example of a fractional compression module 8000, according to embodiments. Fractional compression module 8000 may include successive cancellation node 8100, successive cancellation node 8300, and successive cancellation node 8500, which may be configured to perform a portion of a successive cancellation process used to decode values such as polar coded values. In embodiments, fractional compressor 8200 and fractional decompressor 8400 may be used to compress values used during the successive cancellation process. In embodiments, some successive cancellation nodes, for example successive cancellation node 8300, may operate on compressed codewords, and may provide output which can be used by another successive cancellation node, for example successive cancellation node 8100, or which may be decompressed by fractional decompressor 8400 and then provided to another successive cancellation node, for example successive cancellation ode 8500. For example, as can be seen in FIG. 8, the output of successive cancellation node 8300 may be provided as feedback to successive cancellation node 8100. In embodiments, fractional compression may be used to compress the information provided as feedback. In embodiments, fractional compression module may include any number or arrangement of successive cancellation nodes, and any number or arrangement of compressors or decompressors, as desired.

In embodiments, some or all of the components in fractional compression module 6000, fractional compression module 7000, or fractional compression module 8000 may be included in, or may be used by or in conjunction with, ECC encoder/decoder 1260 or successive cancellation decoder 1263, while decoding coded values, for example polar coded values. In embodiments, one or more of fractional compressor 6100, fractional compressor 7100, and fractional compressor 8200 may correspond to any of the compressors or fractional compressors described herein. In embodiments, one or more of fractional decompressor 7300 and fractional decompressor 8400 may correspond to any of the decompressors or fractional decompressors described herein.

Although process 4000 and fractional compression in general are described herein in the context of ECC decoding, embodiments are not limited thereto. For example, fractional compression may be used to reduce bus size or memory size in any situation which relates to values that cannot be expressed as a power of 2. For example, such non-dyadic values may be encountered in many different technological contexts, including but not limited to coordinates for location-based technologies such as mapping or navigation systems, audio files generated by analog-to-digital converters, digital images generated by image sensors, biomedical data such as heart rate, respiratory rate, oxygen saturation level, sugar level, or any other type of data captured by biomedical sensors, or any other context as desired. For example, process 4000 and fractional compression in general may be useful in situations in which an analog phenomenon is measured or stored digitally.

In embodiments, the fractional compressors and decompressors described herein may be implemented using hardware such as combinatorial logic circuits or gates. Accordingly, the range of the values may be fixed, and the hardware may be configured to perform fractional compression and decompression using a predetermined prefix table. In embodiments, the fractional compressors and decompressors described herein may be implemented using any combination of software, firmware, or programmable circuits such as field-programmable gate arrays. Accordingly, the range of the values may be variable, and various different prefix tables may constructed during operation of the fractional compressors and decompressors. In embodiments, the fractional compressors and decompressors described herein may be implemented using any combination of hardware, software, firmware, or programmable circuits, as desired.

Figure 9A:
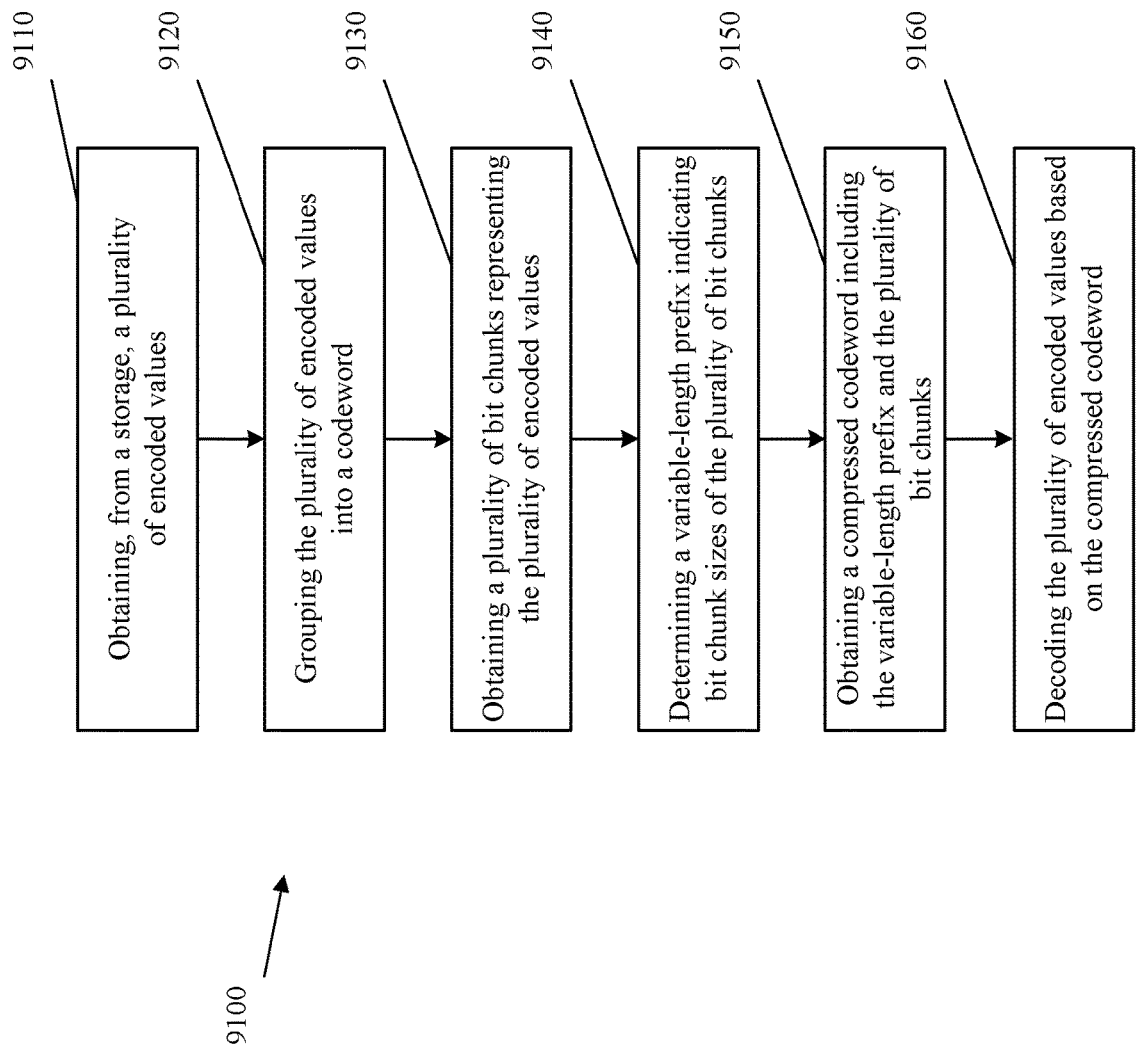
FIGS. 9A-9C are flowcharts of processes for controlling a storage systems and devices, according to embodiments.

FIG. 9A is a flowchart of a process 9100 of controlling a storage system, according to embodiments. In some implementations, one or more process blocks of FIG. 9A may be performed by memory system 1000, or any of the compressors or decompressors described herein.

As shown in FIG. 9A, the process 9100 may include obtaining, from a storage, a plurality of encoded values at operation 9110. In embodiments each value of the plurality of encoded values may have a predetermined value length and be within a predetermined range, and the predetermined range not be a power of 2. In embodiments, the storage may correspond to memory system 1000 or memory device 1100.

As further shown in FIG. 9A, the process 9100 may include grouping the plurality of encoded values into a codeword at operation 9120.

As further shown in FIG. 9A, the process 9100 may include obtaining a plurality of bit chunks at operation 9130. In embodiments, each bit chunk of the plurality of bit chunks may represent a corresponding encoded value of the plurality of encoded values, and a length of the each bit chunk may be selected from among one or more predetermined bit chunk lengths which are determined based on the predetermined range.

As further shown in FIG. 9A, the process 9100 may include selecting a variable-length prefix from among a plurality of variable-length prefixes at operation 9140. In embodiments, the variable-length prefix may indicate bit chunk lengths of the plurality of bit chunks.

As further shown in FIG. 9A, the process 9100 may include obtaining a compressed codeword including the variable-length prefix and the plurality of bit chunks at operation 9150.

As further shown in FIG. 9A, the process 9100 may include decoding the plurality of encoded values based on the compressed codeword at operation 9160.

In embodiments, the plurality of encoded values may be a first plurality of encoded values, the codeword may be a first codeword, the plurality of bit chunks may be a first plurality of bit chunks, the variable-length prefix may be a first variable-length prefix, and the compressed codeword may be a first compressed codeword, and the process 9100 may further include obtaining, from the storage, a second plurality of encoded values, wherein a number of the second plurality of encoded values is same as a number of the first plurality of encoded values; grouping the second plurality of encoded values into a second codeword, wherein a length of the second codeword is same as a length of the first codeword; obtaining a second plurality of bit chunks based on the second plurality of encoded values; selecting a second variable-length prefix based on bit chunk lengths of the second plurality of bit chunks, wherein the bit chunk lengths of the second plurality of bit chunks are different from the bit chunk lengths of the first plurality of bit chunks, and wherein a length of the second variable-length prefix is different from a length of the first variable-length prefix; obtaining a second compressed codeword including the second variable-length prefix and the second plurality of bit chunks, wherein a length of the second compressed codeword is same as a length of the first compressed codeword; and decoding the second plurality of encoded values based on the second compressed codeword.

In embodiments, the obtaining of the plurality of bit chunks may include comparing an encoded value of the plurality of encoded values to a threshold value; based on the value being smaller than the threshold value, setting a length of a bit chunk corresponding to the encoded value as a first bit chunk length, and obtaining the bit chunk based on the encoded value; based on the value being greater than or equal to the threshold value, setting the length of the bit chunk corresponding to the encoded value as a second bit chunk length; and obtaining the bit chunk based on a result of subtracting the threshold value from the encoded value. In embodiments, the subtracting the threshold value from the encoded value may correspond to the determining of the offset described above.

In embodiments, the first bit chunk length and the second bit chunk length may be smaller than the predetermined value length, the first bit chunk length may be larger than the second bit chunk length, and the threshold value, the first bit chunk length, and the second bit chunk length are determined based on the predetermined range.

In embodiments, the first bit chunk length may correspond to a first sub-range, the second bit chunk length may correspond to a second sub-range, the predetermined range may be equal to a sum of the first sub-range and the second sub-range, and the first sub-range and the second sub-range may be powers of 2. In embodiments, the first sub-range and the second sub-range may correspond to the power-of-2 decompositions of the range described above.

In embodiments, each of the one or more predetermined bit chunk lengths may be less than $\lceil \log_2 N \rceil$, where N represents the range.

Figure 9B:
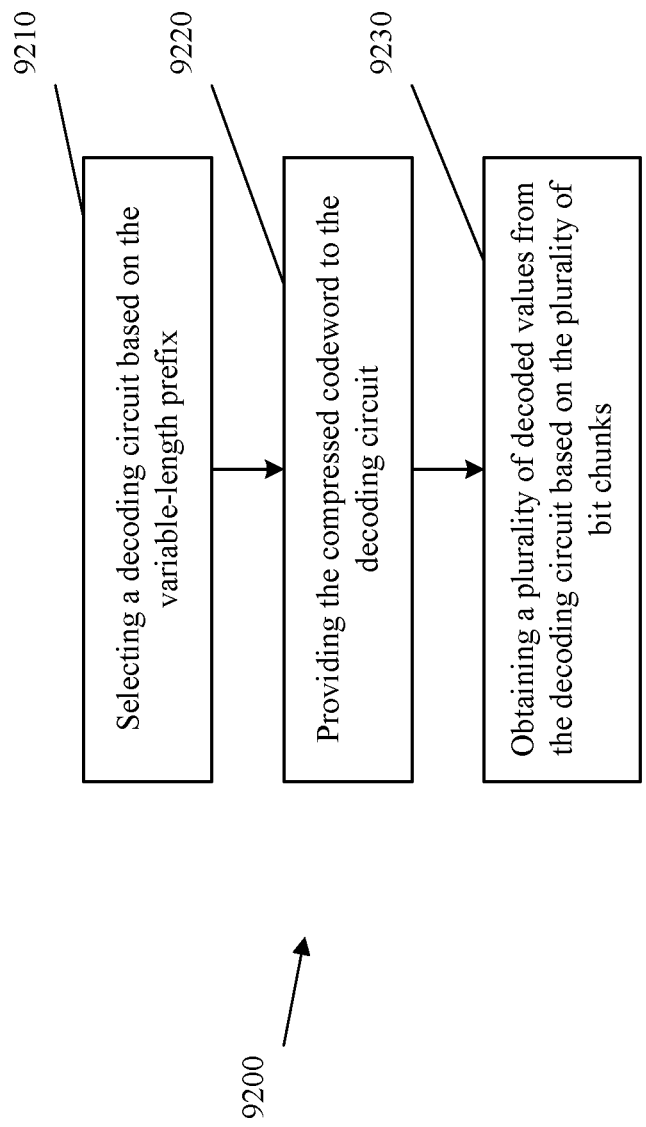

FIG. 9B is a flowchart of a process 9200 of controlling a storage system, according to embodiments. In some implementations, one or more process blocks of FIG. 9B may be performed by memory system 1000, or any of the compressors or decompressors described herein.

In embodiments, one or more process blocks of process 9200 may be performed after process blocks of process 9100.

As shown in FIG. 9B, the process 9200 may include selecting, based on the variable-length prefix, a decoding circuit from among a plurality of decoding circuits at operation 9210. In embodiments, the plurality of decoding circuits may correspond to first through nth decoder circuits 6310-6330.

As further shown in FIG. 9B, process 9200 may include providing the compressed codeword to the decoding circuit at operation 9220, and obtaining a plurality of decoded values from the decoding circuit based on the plurality of bit chunks at operation 9230.

In embodiments, the plurality of decoding circuits may be included in an ECC decoder, the plurality of encoded values may be encoded using a polar code, and the decoding circuit may be configured to decode the compressed codeword using successive cancellation decoding. In embodiments, the ECC decoder may correspond to any of ECC encoder/decoder 1260 and successive cancellation decoder 1263.

Figure 9C:
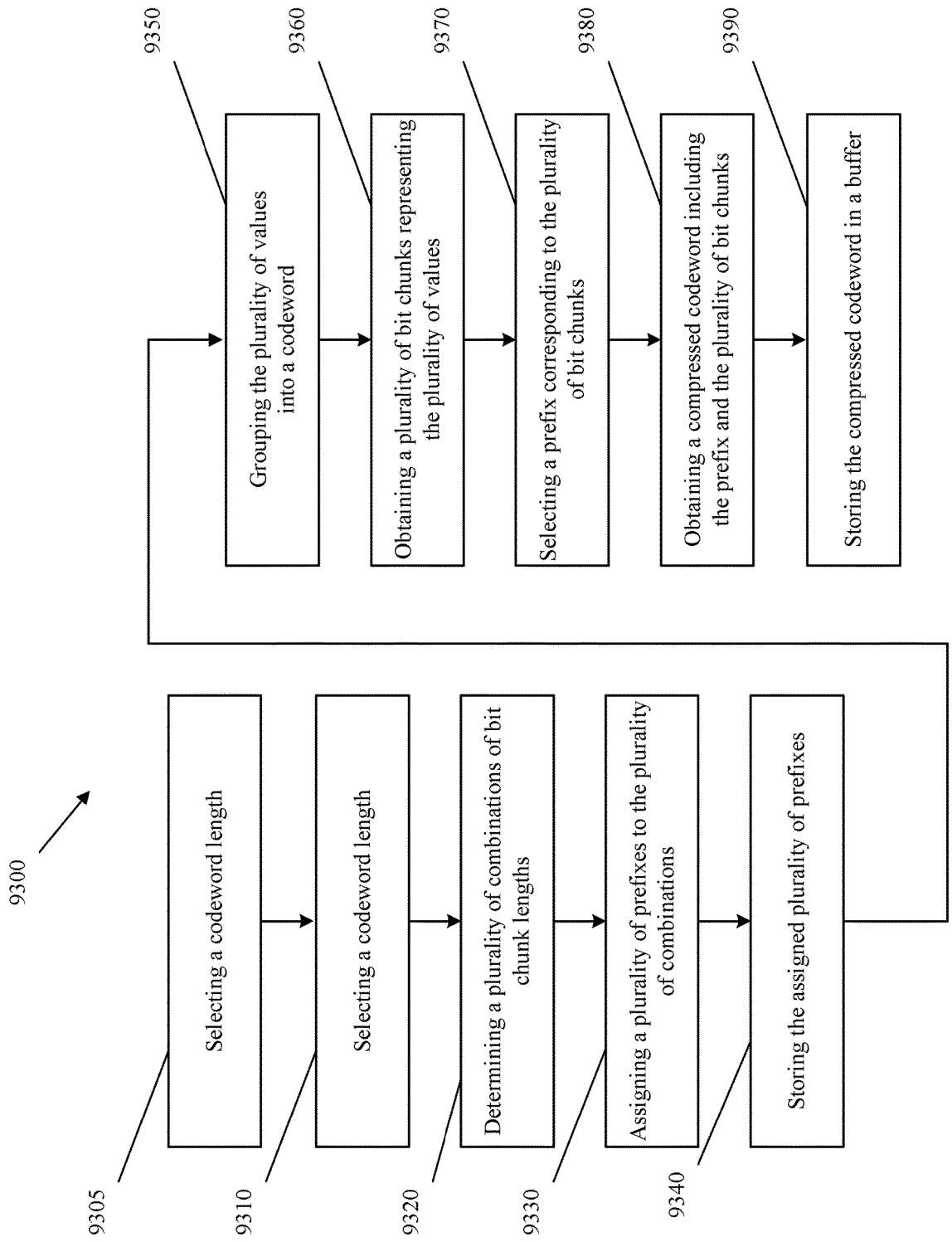

FIG. 9C is a flowchart of a process 9300 of controlling a storage device, according to embodiments. In some implementations, one or more process blocks of FIG. 9C may be performed by memory system 1000, or any of the compressors or decompressors described herein.

As shown in FIG. 9C, the process 9300 may include obtaining, from a memory, a plurality of values at operation 9305. In embodiments, each value of the plurality of values may be within a range, and the range may be not a power of 2. In embodiments, the memory may correspond to memory system 1000 or memory device 1100.

As further shown in FIG. 9C, the process 9300 may include selecting a codeword length at operation 9310. In embodiments, the codeword length may be selected based on the range.

As further shown in FIG. 9C, the process 9300 may include determining a plurality of combinations of bit chunk lengths at operation 9320. In embodiments, a number of the plurality of combinations may be based on a number of power-of-2 components of the range As further shown in FIG. 9C, the process 9300 may include assigning a plurality of prefixes to the plurality of combinations at operation 9330. In embodiments, a sum of the bit chunk lengths included in the each combination and a length of a corresponding prefix assigned to the each combination may be less than the codeword length.

As further shown in FIG. 9C, the process 9300 may include storing the assigned plurality of prefixes in a table at operation 9340. In embodiments, the table may correspond to the prefix table discussed above.

As further shown in FIG. 9C, the process 9300 may include grouping the plurality of values into a codeword having the codeword length at operation 9350.

As further shown in FIG. 9C, the process 9300 may include obtaining a plurality of bit chunks at operation 9360. In embodiments, each bit chunk of the plurality of bit chunks may represent a corresponding value of the plurality of values, and a length of the each bit chunk may be selected from among the bit chunk lengths.

As further shown in FIG. 9C, the process 9300 may include selecting a prefix corresponding to the plurality of bit chunks based on the table at operation 9370.

As further shown in FIG. 9C, the process 9300 may include obtaining a compressed codeword including the prefix and the plurality of bit chunks at operation 9380.

As further shown in FIG. 9C, the process 9300 may include storing the compressed codeword in a buffer at operation 9390. In embodiments, the buffer may correspond to buffer 7200 discussed above.

In embodiments, the plurality of values may be a first plurality of values, the codeword may be a first codeword, the plurality of bit chunks may be a first plurality of bit chunks, the prefix may be a first prefix, and the compressed codeword may be a first compressed codeword, and the process 9300 may further include obtaining, from the memory, a second plurality of values, wherein a number of the second plurality of values is same as a number of the first plurality of values; grouping the second plurality of values into a second codeword having the codeword length; obtaining a second plurality of bit chunks based on the second plurality of values; selecting a second prefix based on bit chunk lengths of the second plurality of bit chunks, wherein the bit chunk lengths of the second plurality of bit chunks are different from the bit chunk lengths of the first plurality of bit chunks, and wherein a length of the second prefix is different from a length of the first prefix; obtaining a second compressed codeword including the second prefix and the second plurality of bit chunks, wherein a length of the second compressed codeword is same as a length of the first compressed codeword; and decoding the second plurality of values based on the second compressed codeword.

In embodiments, the obtaining of the plurality of bit chunks may include comparing a first value of the plurality of values to a threshold value; based on the first value being smaller than the threshold value, setting a length of a first bit chunk corresponding to the first value as a first bit chunk length, and obtaining the first bit chunk based on the value; comparing a second value of the plurality of values to the threshold value; and based on the second value being greater than or equal to the threshold value, setting a length of a second bit chunk corresponding to the value as a second bit chunk length, and obtaining the second bit chunk based on a result of subtracting the threshold value from the value.

In embodiments, the process 9300 may further include obtaining the compressed codeword from the buffer; extracting the prefix from the compressed codeword; determining the first bit chunk length and the second bit chunk length based on the prefix and the table; obtaining the first value based on the first bit chunk; and obtaining the second value by adding the threshold value to the second bit chunk.

Although FIGS. 9A-9C show example blocks of the processes 9100-9300, in some implementations, the processes 9100-9300 may include additional blocks, fewer blocks, different blocks, or differently arranged blocks than those depicted in FIGS. 9A-9C. Additionally, or alternatively, two or more of the blocks of the processes 9100-9300 may be arranged or combined in any order, or performed in parallel.

Figure 10:
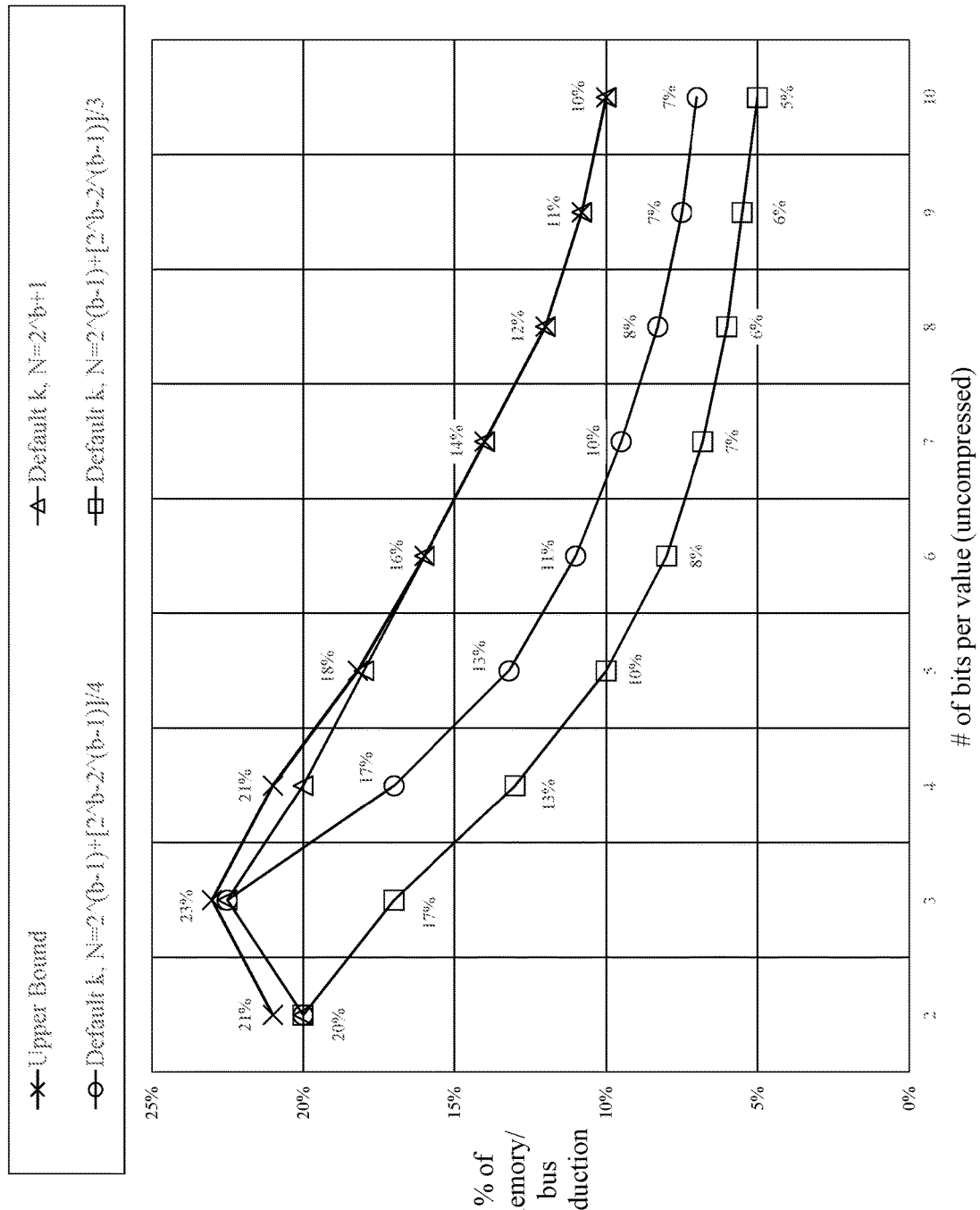
FIG. 10 is a chart illustrating memory and bus savings, according to embodiments.

FIG. 10 is a chart illustrating memory and bus savings, according to embodiments. FIG. 10 illustrates examples of a percentage of memory/bus savings versus a number of uncompressed assigned bits per value. The savings were calculated for a variety of N with default k. In embodiments, savings can improve with higher value of k. With default k, savings range from 5% to 23%.

In embodiments, a compressor/decompressor may be implemented using very large-scale integration (VLSI) design which includes only combinatorial logic and can process the fractional compression or fractional decompression within, for example, a single cycle.

The algorithm complexity, expressed in gate-count, may be proportional to the number of values per processing unit—k, and the number of elements in N decomposition—m. In order to evaluate the gate count, the prefix code size $m^k$ may serve as a relational area estimator.

As an example, a compressor/decompressor consistent with embodiments was implemented for N=80, 17, 3 and k=3, 5, 5 respectively. Design was performed in Verilog hardware description language (HDL) and synthesized with Synopsis Design Compiler on 28 nm Samsung process. Results reported in Table 10 below:

TABLE 10

| Number of Gates per 28 nm compressor/decompressor | | | |
|---|---|---|---|
| N, k | Compression | Compressor | Decompressor |
| N = 80, k = 3 | 21b to 19b | 295 | 95 |
| N = 48, k = 5 | 30b to 28b | 903 | 337 |
| N = 17, k = 5 | 25b to 21b | 576 | 128 |
| N = 3, k = 3 | 6b to 5b | 43 | 50 |

Data provided for a single compressor/decompressor with k values input/output. Note that if memory is required for higher bandwidth (reading higher amount of values per cycle) compressor/decompressor logic units may be duplicated as required and operate in parallel.

Compared with embodiments of the present disclosure discussed above, related-art compression methods as enumerative coding, Huffman, Tunstall or arithmetic coding cannot guarantee reduction in memory size since they reduce the average codeword size, but at worst-case data patterns all $\lceil \log_2 N \rceil$ bits are utilized. Moreover, they consume a higher amount of hardware due to a larger prefix size per compressor/decompressor.

Figure 11:
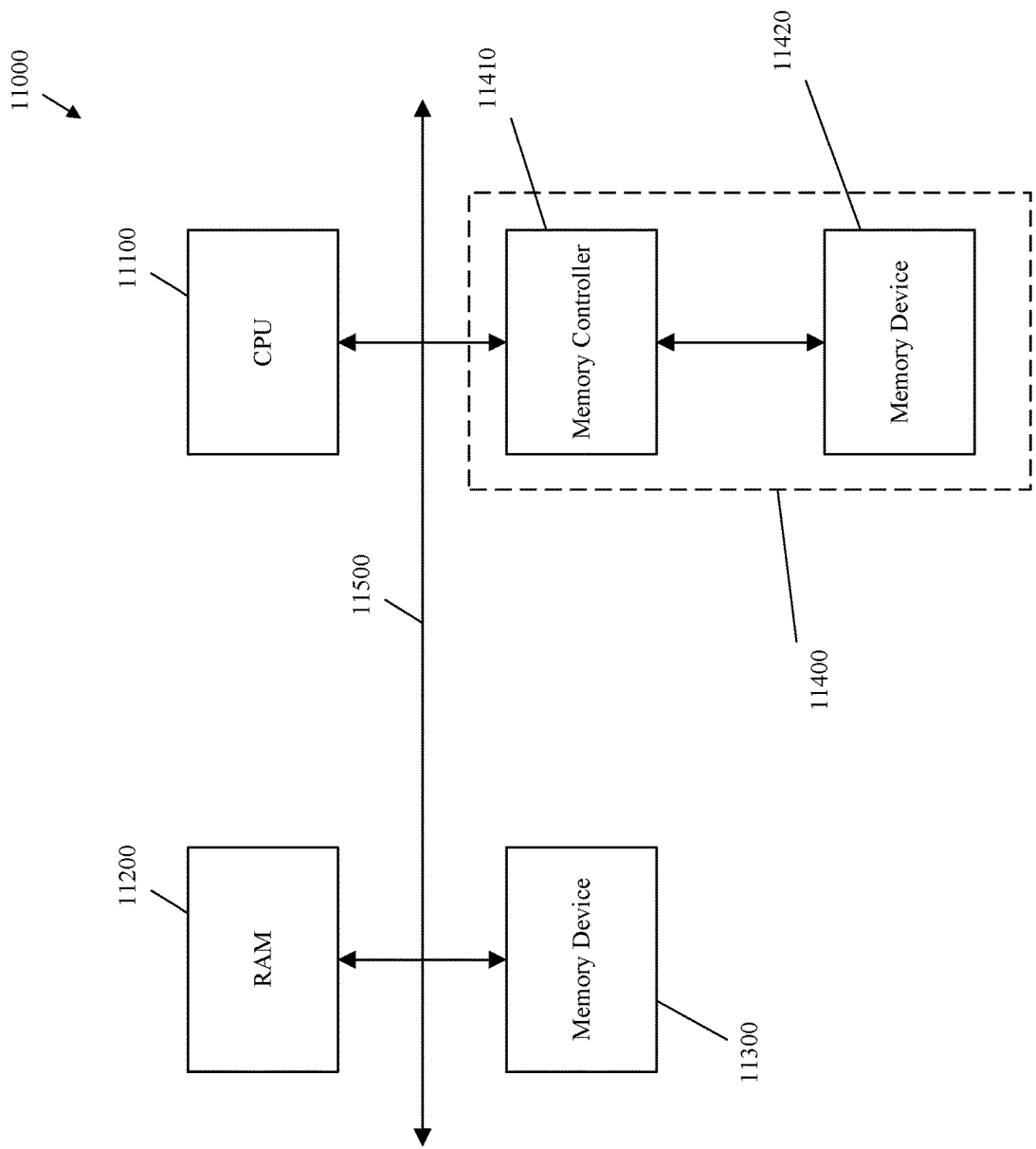
FIG. 11 is a block diagram of computer system including a memory system according to embodiments.

FIG. 11 is a block diagram of a computer system 11000 including a memory system according to embodiments. The computer system 11000, such as a mobile device, a desktop computer, and a server, may employ a memory system 11400 according to embodiments.

The computer system 11000 may include a central processing unit 11100, a RAM 11200, a user interface 11300, and the memory system 11400, are electrically connected to buses 11500. The host as described above may include the central processing unit 11100, the RAM 11200, and the user interface 11300 in the computer system 11000. The central processing unit 11100 may control the entire computer system 11000 and may perform calculations corresponding to user commands input via the user interface 11300. The RAM 11200 may function as a data memory for the central processing unit 11100, and the central processing unit 11100 may write/read data to/from the memory system 11400.

As in example embodiments described above, the memory system 11400 may include a memory controller 11410 and a memory device 11420. The memory controller 11410 may include an encoder and a decoder, and the memory device 11420 may include a cell array including a plurality of memory cells.

According to embodiments, the memory controller 11410 may be implemented by the controller 1200 discussed above with reference to FIG. 1, and the memory device 11420 may be implemented by the memory device 1100 discussed above with reference to FIG. 1.

Figure 12:
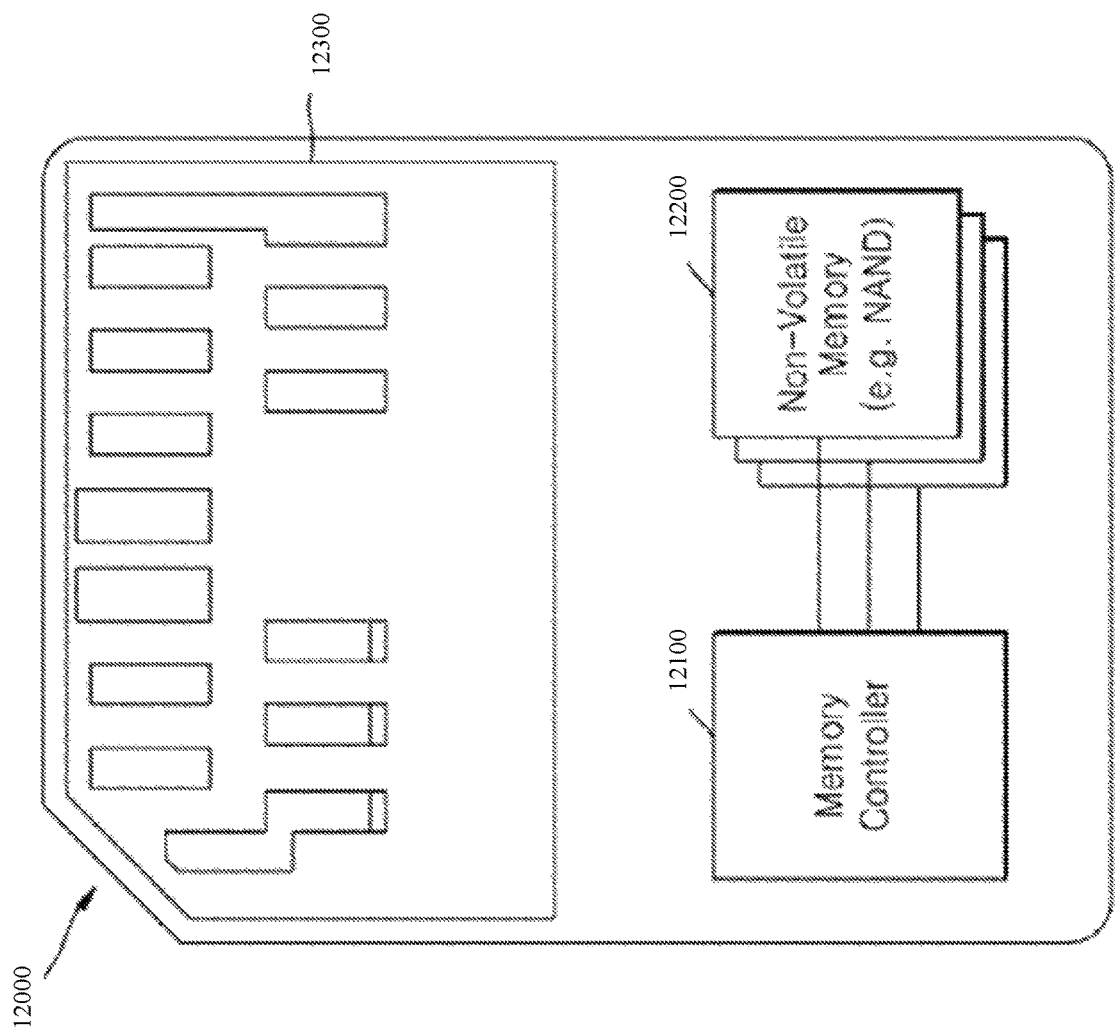
FIG. 12 is a block diagram of a memory card according to embodiments.

FIG. 12 is a block diagram showing a memory card 12000 according to embodiments. The memory system 1000 according to example embodiments discussed above with reference to FIG. 1 may be the memory card 12000. For example, the memory card 12000 may include an embedded multimedia card (eMMC) or a secure digital (SD) card. As shown in FIG. 12, the memory card 12000 may include a memory controller 12100, a non-volatile memory 12200, and a port region 12300. The memory controller 12100 may be implemented by the controller 1200 discussed above with reference to FIG. 1, and the non-volatile memory 12200 shown in FIG. 12 may be implemented by the memory device 1100 discussed above with reference to FIG. 1.

The memory controller 12100 may include an encoder and a decoder. The encoder and the decoder may perform an encoding method and a decoding method according to embodiments. The memory controller 12100 may communicate with an external host via the port region 12300 in compliance with a pre-set protocol. The protocol may be eMMC protocol, SD protocol, SATA protocol, SAS protocol, or USB protocol. The non-volatile memory 12200 may include memory cells which retain data stored therein even if power supplied thereto is blocked. For example, the non-volatile memory 12200 may include a flash memory, a magnetic random access memory (MRAM), a resistance RAM (RRAM), a ferroelectric RAM (FRAM), or a phase change memory (PCM).

According to embodiments, memory controller 12100 and non-volatile memory 12200 may be implemented, respectively, by the controller 1200 and the memory device 1100 discussed above with reference to FIG. 1.

Figure 13:
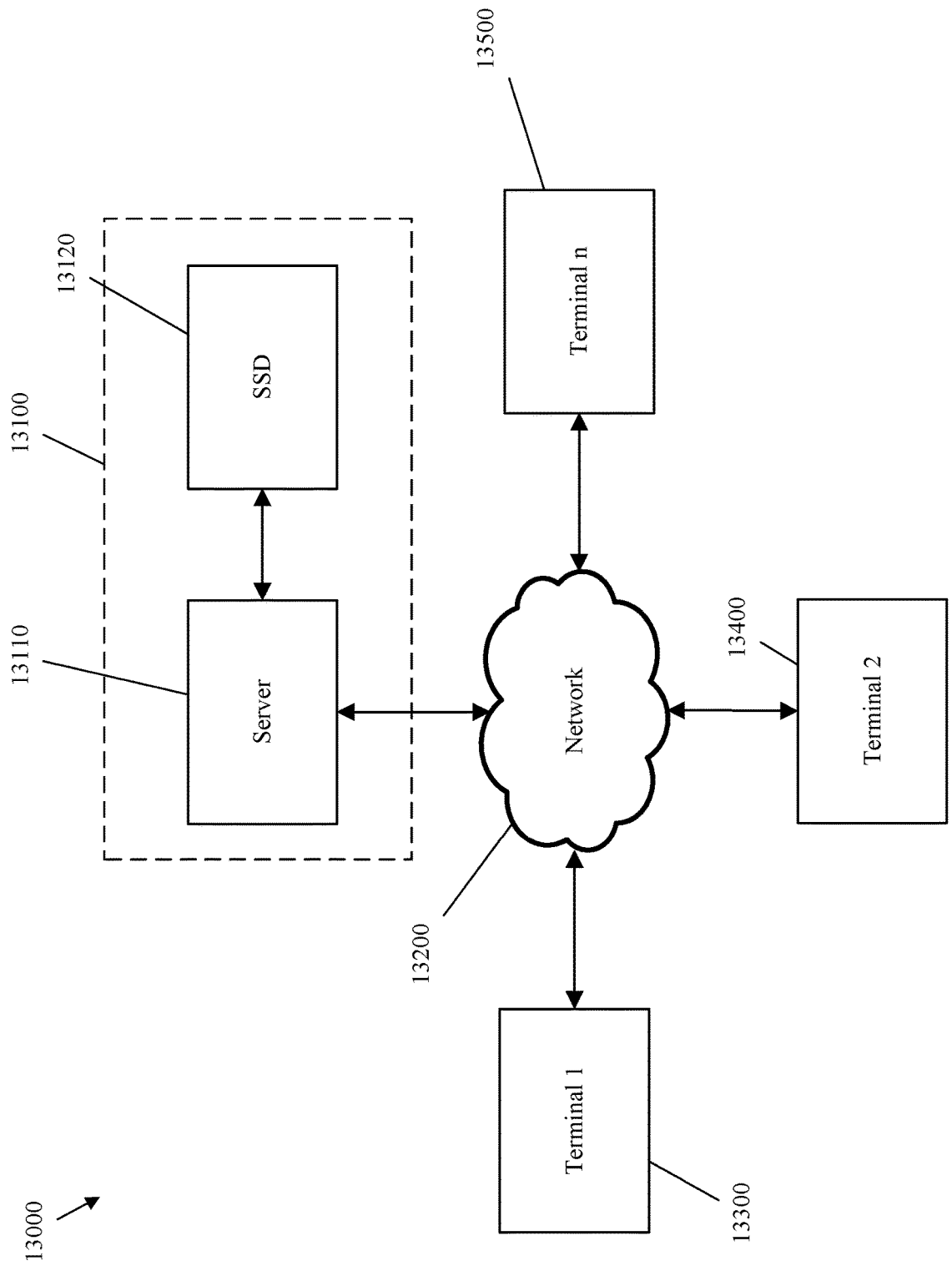
FIG. 13 is a block diagram of a network system including a memory system according to embodiments.

FIG. 13 is a block diagram of a network system 13000 including a memory system according to embodiments. As shown in FIG. 13, the network system 13000 may include a server system 13100 and a plurality of terminals 13300, 13400, and 13500 that are connected via a network 13200. The server system 13100 may include a server 13110 for processing requests received from the plurality of terminals 13300, 13400, and 13500 connected to the network 13200 and an SSD 13120 for storing data corresponding to the requests received from the terminals 13300, 13400, and 13500. Here, the SSD 13120 may be a memory system according to embodiments.

According to embodiments, SSD 13120 may be implemented by the memory system 1000 discussed above with reference to FIG. 1.

Meanwhile, a memory system according to embodiments may be mounted via any of various packages. For example, a memory system according to embodiments may be mounted via any of packages including package on package (PoP), ball grid arrays (BGAs), chip scale packages (CSPs), plastic leaded chip Carrier (PLCC), plastic dual in-line package (PDIP), die in waffle pack, die in wafer form, chip on board (COB), ceramic dual in-line package (CERDIP), plastic metricquad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of the embodiments and is not to be construed as limiting thereof. Although a few embodiments have been described, those skilled in the art will readily appreciate that many modifications are possible in the embodiments without materially departing from the present scope.

What is claimed is:

1. A storage system, comprising:
a storage device configured to store a plurality of encoded values, wherein each value of the plurality of encoded values has a predetermined value length and is within a predetermined range, and wherein the predetermined range is non-dyadic; and
at least one processor configured to:
group the plurality of encoded values into a codeword;
obtain a plurality of bit chunks, wherein each bit chunk of the plurality of bit chunks represents a corresponding encoded value of the plurality of encoded values, and wherein a length of the each bit chunk is selected from among one or more predetermined bit chunk lengths which are determined based on the predetermined range;
select a variable-length prefix from among a plurality of variable-length prefixes, wherein the variable-length prefix indicates bit chunk lengths of the plurality of bit chunks;
obtain a compressed codeword including the variable-length prefix and the plurality of bit chunks; and
decode the plurality of encoded values based on the compressed codeword to obtain reconstructed data corresponding to the encoded values.

2. The storage system of claim 1, wherein, during the decoding, the at least one processor is further configured to:
select, based on the variable-length prefix, a decoding circuit from among a plurality of decoding circuits;
provide the compressed codeword to the decoding circuit; and
obtain a plurality of decoded values from the decoding circuit based on the plurality of bit chunks.

3. The storage system of claim 2, further comprising an error correction coding (ECC) decoder including the plurality of decoding circuits,
wherein the plurality of encoded values are encoded using a polar code, and
wherein the decoding circuit is configured to decode the compressed codeword using successive cancellation decoding.

4. The storage system of claim 1, wherein the plurality of encoded values is a first plurality of encoded values, the codeword is a first codeword, the plurality of bit chunks is a first plurality of bit chunks, the variable-length prefix is a first variable-length prefix, and the compressed codeword is a first compressed codeword,
wherein the storage device is further configured to store a second plurality of encoded values, and
wherein the at least one processor is further configured to:
obtain the second plurality of encoded values, wherein a number of the second plurality of encoded values is same as a number of the first plurality of encoded values;
group the second plurality of encoded values into a second codeword, wherein a length of the second codeword is same as a length of the first codeword;

obtain a second plurality of bit chunks based on the second plurality of encoded values;

select a second variable-length prefix based on bit chunk lengths of the second plurality of bit chunks, wherein the bit chunk lengths of the second plurality of bit chunks are different from the bit chunk lengths of the first plurality of bit chunks, and wherein a length of the second variable-length prefix is different from a length of the first variable-length prefix;

obtain a second compressed codeword including the second variable-length prefix and the second plurality of bit chunks, wherein a length of the second compressed codeword is same as a length of the first compressed codeword; and decode the second plurality of encoded values based on the second compressed codeword.

5. The storage system of claim 1, wherein, during the obtaining of the plurality of bit chunks, the at least one processor is further configured to:

compare an encoded value of the plurality of encoded values to a threshold value;

based on the value being smaller than the threshold value, set a length of a bit chunk corresponding to the encoded value as a first bit chunk length, and obtain the bit chunk based on the encoded value; and based on the value being greater than or equal to the threshold value, set the length of the bit chunk corresponding to the encoded value as a second bit chunk length, and obtain the bit chunk based on a result of subtracting the threshold value from the encoded value.

6. The storage system of claim 5, wherein the first bit chunk length and the second bit chunk length are smaller than the predetermined value length, wherein the first bit chunk length is larger than the second bit chunk length, and wherein the threshold value, the first bit chunk length, and the second bit chunk length are determined based on the predetermined range.

7. The storage system of claim 5, wherein the first bit chunk length corresponds to a first sub-range, wherein the second bit chunk length corresponds to a second sub-range, wherein the predetermined range is equal to a sum of the first sub-range and the second sub-range, and wherein the first sub-range and the second sub-range are dyadic.

8. The storage system of claim 1, wherein each of the one or more predetermined bit chunk lengths is less than $\lceil \log e\ N_i \rceil$, where N represents the predetermined range.

9. A storage device, comprising:

a memory configured to store a plurality of values generated based on input data, wherein each value of the plurality of values is within a range, and wherein the range is non-dyadic;

a buffer; and at least one processor configured to:

select a codeword length, wherein the codeword length is selected based on the range;

determine a plurality of combinations of bit chunk lengths, wherein a number of the plurality of combinations is based on a number of dyadic components of the range;

assign a plurality of prefixes to the plurality of combinations, wherein for each combination, a sum of the bit chunk lengths included in the each combination and a length of a corresponding prefix assigned to the each combination is less than the codeword length;

store the assigned plurality of prefixes in a table;

group the plurality of values into a codeword having the codeword length;

obtain a plurality of bit chunks, wherein each bit chunk of the plurality of bit chunks represents a corresponding value of the plurality of values, and wherein a length of the each bit chunk is selected from among the bit chunk lengths;

select a prefix corresponding to the plurality of bit chunks based on the table;

obtain a compressed codeword including the prefix and the plurality of bit chunks; and store the compressed codeword in the buffer.

10. The storage device of claim 9, wherein the plurality of values is a first plurality of values, the codeword is a first codeword, the plurality of bit chunks is a first plurality of bit chunks, the prefix is a first prefix, and the compressed codeword is a first compressed codeword, wherein the memory is further configured to store a second plurality of values, and wherein the at least one processor is further configured to:

obtain the second plurality of values, wherein a number of the second plurality of values is same as a number of the first plurality of values;

group the second plurality of values into a second codeword having the codeword length;

obtain a second plurality of bit chunks based on the second plurality of values;

select a second prefix based on bit chunk lengths of the second plurality of bit chunks, wherein the bit chunk lengths of the second plurality of bit chunks are different from the bit chunk lengths of the first plurality of bit chunks, and wherein a length of the second prefix is different from a length of the first prefix;

obtain a second compressed codeword including the second prefix and the second plurality of bit chunks, wherein a length of the second compressed codeword is same as a length of the first compressed codeword; and decode the second plurality of values based on the second compressed codeword.

11. The storage device of claim 9, wherein, during the obtaining of the plurality of bit chunks, the at least one processor is further configured to:

compare a first value of the plurality of values to a threshold value;

based on the first value being smaller than the threshold value, set a length of a first bit chunk corresponding to the first value as a first bit chunk length, and obtain the first bit chunk based on the value;

compare a second value of the plurality of values to the threshold value; and based on the second value being greater than or equal to the threshold value, set a length of a second bit chunk corresponding to the value as a second bit chunk length, and obtain the second bit chunk based on a result of subtracting the threshold value from the value.

12. The storage device of claim 11, wherein the at least one processor is further configured to:

obtain the compressed codeword from the buffer;

extract the prefix from the compressed codeword;

determine the first bit chunk length and the second bit chunk length based on the prefix and the table;

obtain the first value based on the first bit chunk; and obtain the second value by adding the threshold value to the second bit chunk.

13. A method of controlling a storage system, the method being executed by at least one processor and comprising:

obtaining, from a storage, a plurality of encoded values, wherein each value of the plurality of encoded values has a predetermined value length and is within a predetermined range, and wherein the predetermined range is non-dyadic;

grouping the plurality of encoded values into a codeword;

obtaining a plurality of bit chunks, wherein each bit chunk of the plurality of bit chunks represents a corresponding encoded value of the plurality of encoded values, and wherein a length of the each bit chunk is selected from among one or more predetermined bit chunk lengths which are determined based on the predetermined range;

selecting a variable-length prefix from among a plurality of variable-length prefixes, wherein the variable-length prefix indicates bit chunk lengths of the plurality of bit chunks;

obtaining a compressed codeword including the variable-length prefix and the plurality of bit chunks; and decoding the plurality of encoded values based on the compressed codeword to obtain reconstructed data corresponding to the encoded values.

14. The method of claim 13, wherein the decoding comprises:

selecting, based on the variable-length prefix, a decoding circuit from among a plurality of decoding circuits;

providing the compressed codeword to the decoding circuit; and obtaining a plurality of decoded values from the decoding circuit based on the plurality of bit chunks.

15. The method of claim 14, wherein the plurality of decoding circuits are included in an error correction coding (ECC) decoder, wherein the plurality of encoded values are encoded using a polar code, and wherein the decoding circuit is configured to decode the compressed codeword using successive cancellation decoding.

16. The method of claim 13, wherein the plurality of encoded values is a first plurality of encoded values, the codeword is a first codeword, the plurality of bit chunks is a first plurality of bit chunks, the variable-length prefix is a first variable-length prefix, and the compressed codeword is a first compressed codeword, and wherein the method further comprises:

obtaining, from the storage, a second plurality of encoded values, wherein a number of the second plurality of encoded values is same as a number of the first plurality of encoded values;

grouping the second plurality of encoded values into a second codeword, wherein a length of the second codeword is same as a length of the first codeword;

obtaining a second plurality of bit chunks based on the second plurality of encoded values;

selecting a second variable-length prefix based on bit chunk lengths of the second plurality of bit chunks, wherein the bit chunk lengths of the second plurality of bit chunks are different from the bit chunk lengths of the first plurality of bit chunks, and wherein a length of the second variable-length prefix is different from a length of the first variable-length prefix;

obtaining a second compressed codeword including the second variable-length prefix and the second plurality of bit chunks, wherein a length of the second compressed codeword is same as a length of the first compressed codeword; and decoding the second plurality of encoded values based on the second compressed codeword.

17. The method of claim 13, wherein, wherein the obtaining of the plurality of bit chunks comprises:

comparing an encoded value of the plurality of encoded values to a threshold value;

based on the value being smaller than the threshold value, setting a length of a bit chunk corresponding to the encoded value as a first bit chunk length, and obtaining the bit chunk based on the encoded value; and based on the value being greater than or equal to the threshold value, setting the length of the bit chunk corresponding to the encoded value as a second bit chunk length, and obtaining the bit chunk based on a result of subtracting the threshold value from the encoded value.

18. The method of claim 17, wherein the first bit chunk length and the second bit chunk length are smaller than the predetermined value length, wherein the first bit chunk length is larger than the second bit chunk length, and wherein the threshold value, the first bit chunk length, and the second bit chunk length are determined based on the predetermined range.

19. The method of claim 17, wherein the first bit chunk length corresponds to a first sub-range, wherein the second bit chunk length corresponds to a second sub-range, wherein the predetermined range is equal to a sum of the first sub-range and the second sub-range, and wherein the first sub-range and the second sub-range are dyadic.

20. A method of controlling a storage device, the method comprising:

obtaining, from a memory, a plurality of values generated based on input data, wherein each value of the plurality of values is within a range, and wherein the range is non-dyadic;

selecting a codeword length, wherein the codeword length is selected based on the range;

determining a plurality of combinations of bit chunk lengths, wherein a number of the plurality of combinations is based on a number of dyadic components of the range;

assigning a plurality of prefixes to the plurality of combinations, wherein for each combination, a sum of the bit chunk lengths included in the each combination and a length of a corresponding prefix assigned to the each combination is less than the codeword length; and storing the assigned plurality of prefixes in a table;

grouping the plurality of values into a codeword having the codeword length;

obtaining a plurality of bit chunks, wherein each bit chunk of the plurality of bit chunks represents a corresponding value of the plurality of values, and wherein a length of the each bit chunk is selected from among the bit chunk lengths;

selecting a prefix corresponding to the plurality of bit chunks based on the table;
obtaining a compressed codeword including the prefix and the plurality of bit chunks; and
storing the compressed codeword in a buffer.

* * * * *